(12) United States Patent
Suenaga et al.

(10) Patent No.: US 7,371,963 B2
(45) Date of Patent: May 13, 2008

(54) PHOTOVOLTAIC POWER GENERATION SYSTEM

(75) Inventors: Takashi Suenaga, Yohkaichi (JP); Taneo Higuchi, Yohkaichi (JP)

(73) Assignee: Kyocera Corporation, Kyoto (JP)

( * ) Notice: Subject to any disclaimer, the term of this patent is extended or adjusted under 35 U.S.C. 154(b) by 711 days.

(21) Appl. No.: 10/631,661

(22) Filed: Jul. 30, 2003

(65) Prior Publication Data

US 2004/0211459 A1 Oct. 28, 2004

(30) Foreign Application Priority Data

Jul. 31, 2002 (JP) .............................. 2002-222434
Aug. 30, 2002 (JP) .............................. 2002-253872

(51) Int. Cl.
*H01L 31/042* (2006.01)
(52) U.S. Cl. .................. 136/293; 323/905; 363/70; 363/95; 363/97
(58) Field of Classification Search ............... 136/293; 323/906; 363/70, 95, 97
See application file for complete search history.

(56) References Cited

U.S. PATENT DOCUMENTS 4,245,286 A * 1/1981 Paulkovich et al. ...... 363/21.11
6,448,489 B2 * 9/2002 Kimura et al. .............. 136/244

FOREIGN PATENT DOCUMENTS

| JP | 2001-255949 | 9/2001 |
| JP | 2001-309560 | 11/2001 |
| JP | 2001-312319 | 11/2001 |
| JP | 2002-051571 | 2/2002 |
| JP | 2002-084763 | 3/2002 |
| JP | 2002-199739 | 7/2002 |
| JP | 2002-233141 | 8/2002 |
| JP | 2002-238246 | 8/2002 |

OTHER PUBLICATIONS

"Peripheral apparatuses for solar cell" by Toru Arai, Light Series No. 3, May 2002, pp. 62-66.

* cited by examiner

*Primary Examiner*—Kishor Mayekar
(74) *Attorney, Agent, or Firm*—Hogan & Hartson LLP

(57) ABSTRACT

An object of the present invention is to provide a photovoltaic power generation system which is capable of achieving system linkage of a plurality of solar cell strings having different output voltages to a commercial electric power system with ease, and which enables efficient use of the maximum output electric power. It is a photovoltaic power generation system characterized by disposing voltage regulating means that regulates a DC voltage outputted from non-standard solar cell string between a standard solar cell string and electric power converting means, and regulating an output voltage of the non-standard solar cell string to the side of an output voltage of the standard solar cell string by the use of the voltage regulating means.

27 Claims, 21 Drawing Sheets

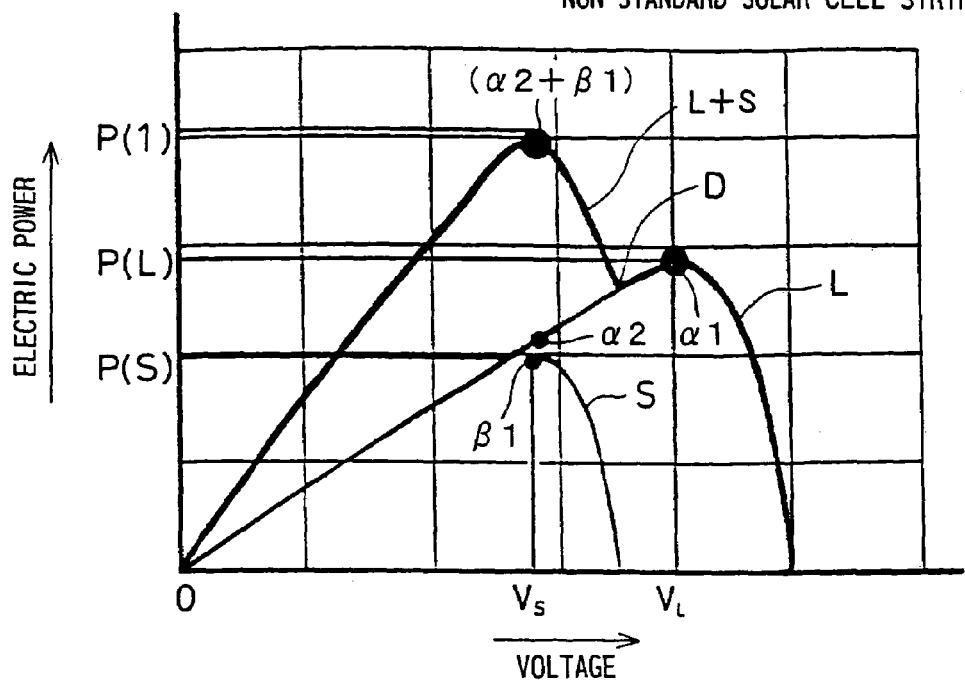
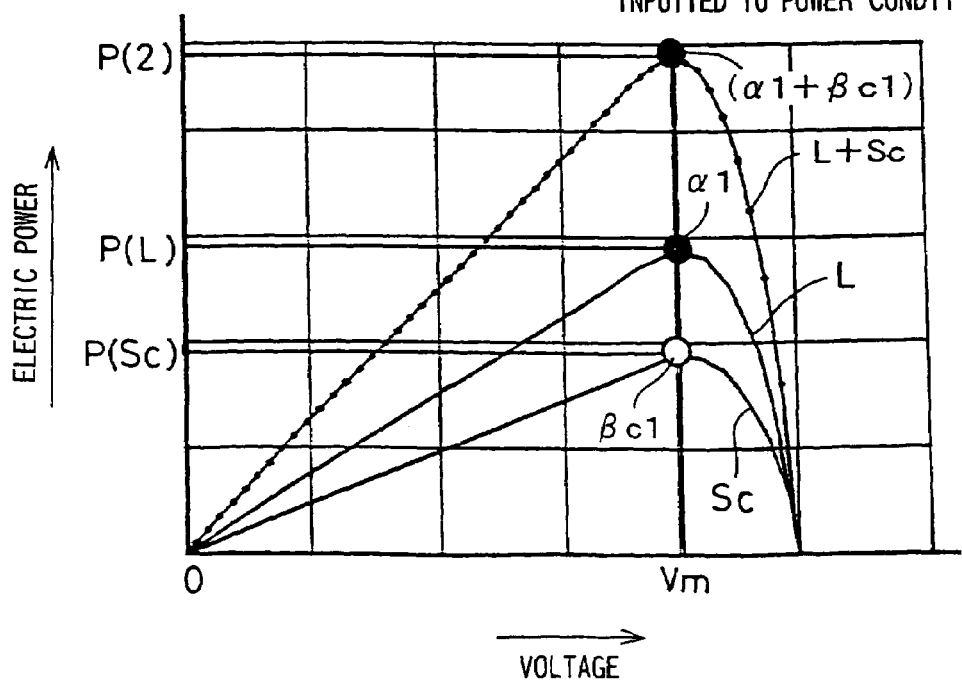

L: ELECTRIC POWER OUTPUT CHARACTERISTIC OF STANDARD SOLAR CELL STRING
S: ELECTRIC POWER OUTPUT CHARACTERISTIC OF NON-STANDARD SOLAR CELL STRING

Sc: OUTPUT CHARACTERISTIC OF ELECTRIC POWER OUTPUTTED FROM VOLTAGE REGULATING MEANS
L + Sc: CHARACTERISTIC OF ELECTRIC POWER INPUTTED TO POWER CONDITIONER

PHOTOVOLTAIC POWER GENERATION SYSTEM

BACKGROUND OF THE INVENTION

1. Field of the Invention

The present invention relates to a photovoltaic power generation system that increases alternatives to allow connection of solar cell elements or solar cell element groups (solar cell modules) used for composing a solar cell string installed on a structure such as a roof and that enables accurate tracking of the maximum output point of a solar cell string.

2. Description of the Related Art

FIG. 21 is a block diagram showing a related art photovoltaic power generation system 17. As show in FIG. 21, there is conventionally proposed a photovoltaic power generation system 17 made by connecting a plurality of solar cell strings 11a, 11b in parallel and composed so as to enable acquirement of a maximum output electric power from the solar cell strings 11a, 11b. This photovoltaic power generation system 17 comprises solar cell strings 11a, 11b, each of which is made of a plurality of solar cell elements connected to each other that convert solar energy to electric energy, a connection box 13 that connects backflow prevention diodes 19 for preventing an output current of one of the solar cell strings from flowing back to another solar cell string and serves as connecting means for collecting output voltages from the plural solar cell strings 11a, 11b, and a power conditioner 14 constituted by an electric power converting device for converting DC electric power outputted from the respective solar cell strings 11a, 11b to AC electric power whose voltage/current phase is synchronized with that of a commercial electric power system 16 and a protecting device for detecting any trouble of the commercial electric power system. AC electric power outputted from the power conditioner 14 is supplied to an AC load 15 such as a light or a motor.

In general, in the case of obtaining necessary electric power by using a solar cell string, solar cell strings 11a, 11b are composed of solar cell elements or solar cell modules 18 connected to each other in series, in parallel or in series-parallel, and composed so as to enable acquirement of a voltage and a current that a power conditioner 14 executing electric power conversion can efficiently convert.

However, since the amount of generated electric power of a solar cell string changes depending on an insolation condition and an environment, a point referred to as the maximum output point that a current and voltage of a solar cell string can be taken out most efficiently changes at all times. Then, for the purpose of obtaining the maximum output electric power of the solar cell strings, the power conditioner 14 is controlled so that an operation point of the power conditioner 14 tracks varying maximum output points of the solar cell strings.

However, since the power conditioner 14 controls output electric power of the solar cell strings as a result of collection in the connection box 13, it is impossible to control output electric power of the respective solar cell strings 11a, 11b. Therefore, in order to match output voltages between the solar cell strings, there is a need to equalize the numbers of solar cell elements between the solar cell strings. For example, in the case of the plural solar cell strings 11a, 11b connected in parallel that have different numbers of solar cell elements, the maximum output points of the respective solar cell strings locate on different points, with the result that the efficiency of power generation is lowered in the mass when the power conditioner 14 is operated at a certain output voltage. This results in decrease in conversion efficiency when the composition number of the solar cell modules 18 is arbitrarily set, so that it is impossible to serve a need to, for example, lay the solar cell modules 18 on the entire roof of a house and keep high conversion efficiency.

In recent years, on a house or the like with solar cell modules mounted in which emphasis is laid on appearance, harmony with its environment and individuality, dummy modules which do not generate electric power are placed together with the solar cell module 18 to fill in space, or solar cell modules which are prevented from generating electric power are placed in a vacant part. Moreover, since the unit of expansion of the solar cell modules 18 is a string unit, there arises a case that a difference is made between a necessary capacity of electric power generation and an actual installable capacity, and it is impossible to cause a remaining installable area smaller than that of an installation region of one solar cell string to contribute to electric power generation, with the result that such a problem arises that it is impossible to satisfy a required capacity of electric power generation.

Accordingly, a photovoltaic power generation system that in the case of strings connected in parallel which have different numbers of solar cell elements, voltage regulating means is connected to a string whose number of solar cell elements is smaller so that output voltages from the plural solar cell strings match is disclosed in Japanese Unexamined Patent Publication JP-A 2001-312319.

However, in the above method, because it is required to manually select a boosting voltage ratio by using a contact selection switch disposed to the voltage regulating means at the time of installation of the photovoltaic power generation system, the man-hours at the time of installation increase, and moreover, in the case of mistakenly setting the contact selection switch, an output corresponding to the installation number of the solar cell modules 18 cannot be obtained, and such a problem arises that the photovoltaic power generation system does not work properly.

Moreover, a boosting ratio is fixed at a set value when the boosting voltage ratio is manually set. Therefore, when the installation directions of the solar cell strings are different from each other, a difference is made in operation points for obtaining the maximum outputs of the solar cell strings 11a, 11b because of differences in conditions of insolation to the respective solar cell modules and module temperature conditions. However, since the boosting voltage ratio is fixed, such a problem arises that it is impossible to obtain the true maximum output electric power.

Furthermore, it is necessary to check and control whether setting is properly done at the time of building, and collection, recording and control of the result and work for making a builder do it thoroughly are required.

SUMMARY OF THE INVENTION

In consideration of the problems in a photovoltaic power generation system as described above, an object of the invention is to provide a photovoltaic power generation system capable of achieving system linkage of a plurality of solar cell strings having different output voltages to a commercial electric power system in a simple way, which enables efficient use at the maximum output electric power of the solar cell strings, and which does not cause the problem of wrong setting of a boosting ratio.

The invention provides a photovoltaic power generation system comprising:

a first solar cell string composed of a plurality of solar cell elements or solar cell element groups connected to each other in series;

a second solar cell string composed of a plurality of solar cell elements or solar cell element groups connected to each other in series, the second solar cell string being connected to the first solar cell string in parallel;

electric power converting means for converting DC electric power outputted from these solar cell strings, to AC electric power and controlling so that a maximum output electric power is inputted; and voltage regulating means disposed between the second solar cell string and the electric power converting means, for regulating a DC voltage of the DC electric power outputted from the second solar cell string, to be close to a DC voltage of the DC electric power outputted from the first solar cell string.

Further, in the invention it is preferable that voltage regulation by the voltage regulating means is carried out based on a voltage for a maximum electric power of the second solar cell string.

According to the invention, for example, a photovoltaic power generation system has such a configuration that a plurality of solar cell strings composed of a plurality of solar modules connected to each other in series are linked through a connection box via a power conditioner, with a commercial electric power system, and a first solar cell string including a predetermined standard serial number of solar cell modules or a predetermined standard number of solar cell elements, and a second solar cell string including solar a smaller number of cell modules than the standard serial number of cell modules or a smaller number of solar cell elements than the standard number of solar cell elements are connected to the connection box in parallel. Moreover, voltage regulating means for boosting an output voltage of the second solar cell string up to an output voltage of the first solar cell string is disposed to the first stage, that is, the input side of the connection box.

The first solar cell string is composed of a number of solar cell modules or solar cell elements connected to each other in series which number exists within a range of the power conditioner control. Moreover, for example, in case where a plurality of solar cell strings exist, the first solar cell string is composed of a maximum number of solar cell modules or solar cell elements within a range of capability of connection in series.

Further, the voltage regulating means carries out MPPT (maximum power point tracking) control for the connected solar cell string, whereby it is possible to obtain the maximum output electric power of the second solar cell string, and a boosting voltage ratio is automatically regulated based on an output voltage of the output side which is automatically set, the output voltage becoming equal to a voltage of the first solar cell string which is a control voltage of the power conditioner, and based on an input voltage of the input side supplied from the second solar cell string under MPPT control. Moreover, the voltage regulating means may be driven by output electric power of the first or second solar cell string.

According to the photovoltaic power generation system of the invention, the voltage regulating means that regulates a DC voltage outputted from the second solar cell string is disposed between the first solar cell string and the electric power converting means, the voltage regulating means regulates a DC voltage outputted from the second solar cell string to be close to a voltage outputted from the first solar cell string, and the voltage regulating means regulates a supplied voltage based on a voltage for the maximum electric power of the second solar cell string. Consequently, even when a photovoltaic power generation system that achieves system linkage of a plurality of solar cell strings, each of which has a plurality of solar cell modules connected to each other in series, to a commercial electric power system via a connection box and electric power converting means comprises the first solar cell string and the second solar cell string having different capabilities of electric power generation, it is possible to use the sum of the maximum output electric power from the respective solar cell strings as the maximum output electric power, and it is possible to achieve system linkage of the photovoltaic power generation system to a commercial electric power system. Moreover, for example, the voltage regulating means is connected to only the second solar cell string, and there is no need to connect the voltage regulating means to the first solar cell string. Therefore, the larger the number of the first solar cell strings is than the number of the second solar cell strings, the smaller the number of the voltage regulating means can be.

Further, since a boosting ratio is automatically regulated based on an input voltage and an output voltage, it is unnecessary to set a boosting ratio at the time of installation, and the man-hours of building are reduced. Moreover, since there is no operation failure due to wrong setting, there is no need to check or control whether setting is properly done at the time of building, and collection, recording and control of the check result and work for making a builder do it thoroughly are not required.

Furthermore, it is possible to provide an excellent photovoltaic power generation system that enables acquirement of the true maximum output electric power by using an MPPT control function of the voltage regulating means even when a difference is made in the maximum output operation points of the respective solar cell strings because of a difference in installation conditions of the solar cell strings, for example, when the amounts of insolation to the respective solar cell strings are different.

Further, the voltage regulating means may have voltage regulating functions of both boosting and bucking voltages. For example, it is possible to constitute so as to, when there is a second solar cell string that causes output decrease during a certain time period, carry out bucking voltage regulation in normal time, and carry out voltage regulation of boosting only during a certain time period in order to enable acquirement of electric power of a solar cell string which cannot contribute to electric power generation in bucking voltage regulation, and it is possible to not only increase the amount of generated electric power, but also install a photovoltaic power generation system even at a place which cannot satisfy requirements of installing a conventional solar cell string.

Further, the invention provides a photovoltaic power generation system comprising:

a first solar cell string composed of a plurality of solar cell elements or solar cell element groups connected in series;

a second solar cell string composed of a plurality of solar cell elements or solar cell element groups connected in series, and connected to the first solar cell string in parallel, electric power generated by the second solar cell string being lower than that of the first solar cell string;

electric power converting means for converting DC electric power outputted from these solar cell strings to AC electric power and controlling so that a maximum output power is inputted; and boosting means disposed between the second solar cell string and the electric power converting means, for carrying out boosting DC voltage outputted from the second solar cell string so that a maximum output electric power is inputted and so that the output voltage from the second solar cell string is equal to the output voltage of the first solar cell string, and controlling the regulated voltage so as not to be higher than the output voltage from the first solar cell string.

Further, in the invention it is preferable that, when the second solar cell string begins electric power generation earlier than the first solar cell string, the boosting means stops a boosting operation and the electric power converting means is actuated by the first solar cell string.

According to the invention, the photovoltaic power generation system comprises a first solar cell string composed of a plurality of solar cell elements or solar cell element groups connected in series and a second solar cell string connected to the first solar cell string in parallel, the second solar cell having a lower capability of power generation than that of the first solar cell string, electric power converting means for converting DC electric power outputted from these solar cell strings to AC electric power and controlling so that a maximum output electric power is inputted, and voltage regulating means disposed between the first solar cell string and the electric power converting means, for boosting a DC voltage outputted from the second solar cell string and controlling so that the maximum output electric power is inputted. Since the function of regulating an output voltage of the second solar cell string to an output voltage of the first solar cell string by the voltage regulating means is provided, and furthermore, the electric power converting means is controlled so as not to continuously operate in a state where an output voltage supplied from the voltage regulating means is higher than an output voltage of the first solar cell string, it is possible to solve a problem that the electric power converting means takes a voltage higher than an operation voltage of the first solar cell string for an operation voltage by the voltage regulating means having an automatic boosting function, and the electric power converting means is allowed to carry out optimum control at an optimum control voltage without causing electric power generation loss.

Moreover, when the second solar cell string begins electric power generation earlier than the first solar cell string, a boosting operation of the voltage regulating means is stopped, and the electric power converting means is controlled so as to be actuated by the first solar cell string, with the result that even when the voltage regulating means cannot detect an output voltage of the first solar cell string or control voltage, which is a conversion voltage in electric power conversion of the electric power converting means, it is possible to control, in a state where the first solar cell string does not generate electric power, so as to prevent that the second solar cell string operates independently and the electric power converting means takes a voltage higher than an operation voltage of the first solar cell string for an operation voltage by the voltage regulating means, and it is possible to provide an excellent photovoltaic power generation system that allows the electric power converting means to control at an optimum control voltage.

Still further, the invention provides a photovoltaic power generation system comprising:

a first solar cell string composed of a plurality of solar cell elements connected to each other;

a second solar cell string composed of a plurality of solar cell elements connected to each other, the second solar cell string being connected to the first solar cell string in parallel;

electric power converting means for converting DC electric powers outputted from the first and second solar cell strings and supplied thereto, at a conversion voltage Vm at which a maximum DC electric power is supplied, to AC electric power; and voltage regulating means interposed in a connection path which electrically connects the second solar cell string and the electric power converting means, for regulating a DC voltage of the DC electric power supplied from the second solar cell string so as to be close to a conversion voltage Vm.

According to the invention, by regulating a supplied DC voltage, it is possible to allow the electric power converting means to convert DC electric power to AC electric power at the conversion voltage Vm at which a maximum DC electric power is supplied. In specific, by the electric power converting means, a supplied voltage is regulated so as to become an optimum voltage Vl at which a maximum DC electric power is supplied from the first solar cell string. In other words, the conversion voltage Vm becomes equal to the optimum voltage Vl of the first solar cell string.

Further, the voltage regulating means regulates a DC voltage outputted from the second solar cell string so as to be close to the conversion voltage Vm, and supplies to the electric power converting means. Consequently, it is possible to make the maximum DC electric power supplied to the electric power converting means larger than that in the case of directly supplying DC electric power outputted from the first and second solar cell strings to the electric power converting means.

In this manner, even in case where electric power generation states of the first solar cell string and the second solar cell string are different from each other, for example, when the numbers of solar cell modules included in the respective strings are different, it is possible to increase the capability of electric power generation of the photovoltaic power generation system.

The voltage regulating means regulates a DC voltage supplied from the second solar cell string to the electric power converting means based on information about the conversion voltage Vm. Consequently, it is possible to automatically regulate the amount of regulation of the DC voltage supplied from the second solar cell string, and a person who will install the system does not need to determine the regulation amount in advance.

Therefore, an operation of setting an output voltage of the voltage regulating means at the time of installing a photovoltaic power generation system becomes unnecessary, and the man-hours of building are reduced. Moreover, since there is no operation failure due to wrong setting, there is no need to check or control whether setting is done properly at the time of building.

Further, it is preferable that regulation of DC voltage outputted from the second solar cell string is carried out by the voltage regulating means whenever necessary. Consequently, even when the amount of sunlight which enters to the first solar cell string and the second solar cell string, the ambient temperature and the like change with time, it is possible to operate the electric power converting means at the conversion voltage Vm at which a maximum electric power is supplied whenever necessary, and thus it is possible to provide an excellent photovoltaic power generation system.

Still further, the invention provides a photovoltaic power generation system comprising:

a first solar cell string composed of a plurality of solar cell elements connected to each other;

a second solar cell string composed of a plurality of solar cell elements connected to each other, the second solar cell string being connected to the first solar cell string in parallel;

electric power converting means for converting DC electric power outputted from the first and second solar cell strings and supplied thereto at a conversion voltage Vm at which a maximum DC electric power is supplied, to AC electric power; and voltage regulating means interposed in a connection path which electrically connects the second solar cell string and the electric power converting means, for regulating a DC voltage of the DC electric power supplied from the second solar cell string so that a maximum DC electric power is supplied from the second solar cell string.

According to the invention, the voltage regulating means has an MPPT (maximum power point tracking) control function, thereby being capable of regulating so that the optimum voltage Vs of the second solar cell string is supplied to the voltage regulating means. Consequently, the electric power converting means is allowed to carry out electric conversion at a voltage that a maximum electric power is supplied from both the first and second solar cell strings.

Still further, in the invention it is preferable that DC electric power supplied from the first solar cell string is directly supplied to the electric power converting means.

According to the invention, there is no need to dispose the voltage regulating means to the first solar cell string. Consequently, it is possible to make the number of components and connected equipment smaller as compared with the case where each solar cell string is provided with voltage regulating means.

Still further, in the invention it is preferable that the voltage regulating means is disposed to the second solar cell string so as to be attachable and detachable.

According to the invention, when the state of the solar cell string is changed by, for example, expansion of solar cell modules, it is possible to easily attach and detach the voltage regulating means to and from solar cell strings. Consequently, even after a photovoltaic power generation system is installed, it is possible to easily increase an electric power generation capability.

Still further, in the invention it is preferable that the voltage regulating means has:

a regulating section for supplying the DC electric power from the second solar cell string, to the electric power converting means after DC voltage regulation of at least either boosting or bucking;

a power source section for driving the regulating section by the use of DC electric power supplied from the second solar cell string; and a control section for controlling the regulating section.

According to the invention, the power source section drives the regulating section by the use of DC electric power supplied from the-second solar cell string, whereby the voltage regulating means operates together with the second solar cell string. Consequently, regulation of the second solar cell string is automatically stopped in the nighttime, and it is possible to avoid extra electric power consumption.

Still further, in the invention it is preferable that:

the regulating section comprises a chopper circuit including an inductor, a diode and a switching element, and the control section controls the switching element to either boost or buck a supplied DC voltage.

According to the invention, it is possible to regulate a DC voltage without converting to an AC voltage, and it is possible to boost or buck without using a transformer. Consequently, miniaturization and weight reduction are facilitated, and it is possible to simplify a circuit composition and decrease the cost of manufacturing.

Still further, in the invention it is preferable that:

a backflow prevention diode for preventing current from flowing from the first solar cell string to the second solar cell string is disposed; and the voltage regulating means regulates a DC voltage supplied from the second solar cell string based on the presence of a current flowing from the voltage regulating means to the electric power converting means.

According to the invention, until a current flows from the regulating section to the electric power converting means, a DC voltage outputted from the second solar cell string is regulated, for example, boosted. When a current flows from the regulating section to the electric power converting means, a regulated DC voltage becomes a voltage equal to the conversion voltage Vm. At this moment, the conversion voltage Vm is made to become the optimum voltage Vl of the first solar cell string by the electric power converting means. Therefore, the conversion voltage Vm becomes equal to the optimum voltages Vl, Vs of the respective solar cell strings. Consequently, it is possible to increase the amount of generated electric power.

Still further, in the invention it is preferable that the voltage regulating means:

calculates a voltage ratio between the optimum voltage Vl at which a maximum DC electric power is supplied from the first solar cell string and the optimum voltage Vs at which a maximum DC electric power is supplied from the second solar cell string; and regulates the DC voltage of the DC electric power supplied from the second solar cell string based on the voltage ratio.

According to the invention, the control section calculates a voltage ratio between the optimum voltage Vl of the first solar cell string and the optimum voltage Vs of the second solar cell string. The control section regulates the optimum voltage Vs of the second solar cell string supplied to the boosting section based on this voltage ratio, and makes a DC voltage supplied to the electric power converting means equal to the optimum voltage Vl of the first solar cell string. Therefore, the conversion voltage Vm becomes equal to the optimum voltages Vl, Vs of the respective solar cell strings. Consequently, it is possible to increase the amount of generated electric power.

Still further, in the invention it is preferable that a DC electric power supplied from the second solar cell string is supplied to the electric power converting means after DC voltage regulation of boosting by the voltage regulating means.

According to the invention, a DC voltage supplied from the second solar cell string is boosted and supplied to the electric power converting means. Consequently, it is possible to prevent that DC electric power outputted from the second solar cell string is not added as an output because of voltage shortage.

Still further, in the invention it is preferable that the DC electric power supplied from the second solar cell string is supplied to the electric power converting means after DC voltage bucking by the voltage regulating means.

According to the invention, the DC electric power supplied from the second solar cell string is supplied to the electric power converting means after the DC voltage thereof is bucked. Consequently, even when DC electric power outputted from the second solar cell string is higher than that outputted from the first solar cell string, it is possible to make DC electric power supplied to the electric converting means large. For example, by increasing the electric power generation capability of the second solar cell string, it is possible to decrease the total number of solar cell strings included in a photovoltaic power generation system, and it is possible to decrease the number of wiring.

Still further, in the invention it is preferable that the DC electric power supplied from the second solar cell string is supplied to the electric power converting means after DC voltage regulation of boosting or bucking in accordance with predetermined rules by the voltage regulating means.

According to the invention, the voltage regulating means carries out both a boosting operation and a bucking operation. The bucking operation and the boosting operation are switched in a manner that the bucking operation is carried out when a DC voltage supplied from the second solar cell string is higher than a DC voltage outputted from the first solar cell string, and the boosting operation is carried out when a DC voltage supplied from the second solar cell string is lower than a DC voltage supplied from the first solar cell string.

Further, in a photovoltaic power generation system installed at a place where a decrease of output arises, for example, when the amount of light from the sun is low during a certain time period such as in the morning and evening, by carrying out voltage regulation by a bucking operation in general and by a boosting operation only in a specific time period defined in advance, it is possible to take out electric power of a solar cell string which cannot be taken out in the case of voltage regulation only by a bucking operation.

Still further, in the invention it is preferable that the voltage regulating means controls a DC voltage supplied to the electric power converting means so as not to become higher than a rated maximum DC voltage from the first solar cell string.

Further, according to the invention, it is possible to solve a problem that the electric power converting means mistakenly sets a voltage higher than a rated maximum DC voltage from the first solar cell string as the conversion voltage Vm. Consequently, the electric power converting means is capable of executing optimum control at an optimum control voltage without causing electric power generation loss.

Still further, in the invention it is preferable that the voltage regulating means stops regulation of the DC voltage of the DC electric power supplied from the second solar cell string when the second solar cell string begins electric power generation earlier than the first solar cell string.

Further, according to the invention, even when it is impossible to detect a DC voltage supplied from the first solar cell string or a DC voltage that the electric power converting means operates, it is possible to control so that the electric power converting means does not mistakenly set a voltage higher than a DC voltage supplied from the first solar cell string as the conversion voltage Vm.

Still further, in the invention it is preferable that the voltage regulating means stops regulation of a DC voltage of the DC electric power supplied from the second solar cell string when the second solar cell string begins electric power generation earlier than the first solar cell string, and the electric power converting means converts a DC electric power supplied from the first solar cell string to AC electric power.

Further, according to the invention, it is possible to prevent the electric power converting means from being operated by a DC voltage supplied from the voltage regulating means in a state where the first solar cell string does not generate electric power. Consequently, it is possible to control so that the electric power converting means does not mistakenly set a voltage higher than a DC voltage outputted from the first solar cell string as the conversion voltage Vm. Accordingly prevention of excessive current from flowing in the electric power converting means can be realized.

Still further, in the invention it is preferable that the voltage regulating means determines for which of the first solar cell string or the second solar cell string the electric power converting means carried out DC voltage regulation in order to obtain a maximum DC electric power from either the first solar cell string or the second solar cell, and carries out DC voltage regulation for the DC output electric power from the second solar cell string based on a result of the determination.

According to the invention, it is determined based on which DC electric power of the first solar cell string or the second solar cell string the conversion voltage Vm is set. When the conversion voltage Vm is determined based on DC electric power of the second solar cell string, the voltage regulating means stops a regulating operation, whereby it is possible to control so that the electric power converting means does not mistakenly set a DC voltage outputted from the second solar cell string as the conversion voltage Vm.

BRIEF DESCRIPTION OF THE DRAWINGS

Other and further objects, features, and advantages of the invention will be more explicit from the following detailed description taken with reference to the drawings wherein:

FIGS. 3A and 3B are graphs which present a relation between generated electric power outputted from two solar cell strings 1a, 1b having different output capacities and electric power supplied to a power conditioner 4;

DETAILED DESCRIPTION OF THE PREFERRED EMBODIMENTS

Figure 1:
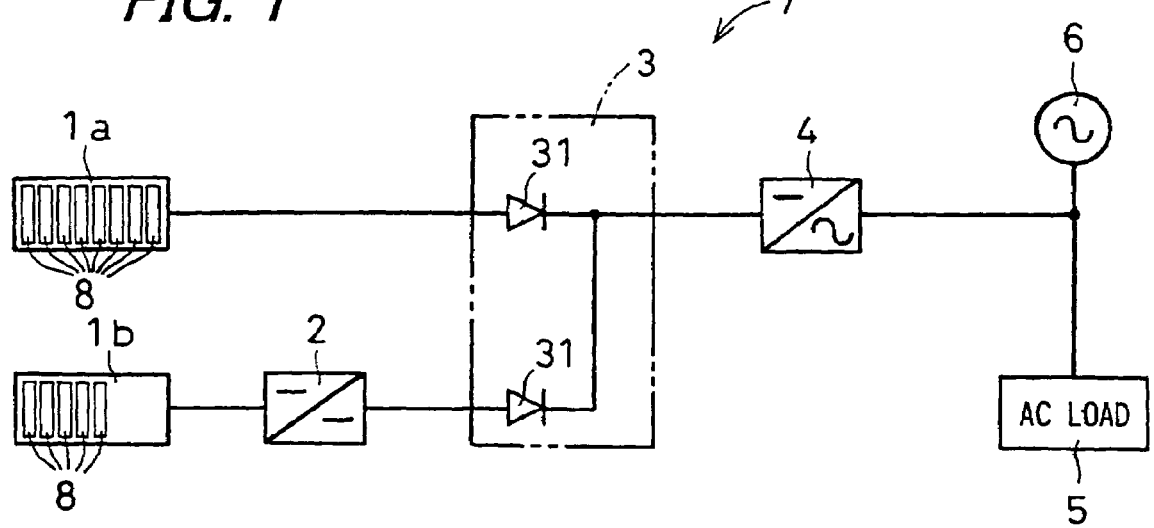
FIG. 1 is a schematic block diagram for diagrammatically describing a photovoltaic power generation system 7 of an embodiment of the present invention.

Now referring to the drawings, preferred embodiments of the invention are described below.

Below, an embodiment of a photovoltaic power generation system relating to the present invention will be described in detail based on drawings which show diagrammatically. The same components as those described before will be denoted by the same reference numerals, and a repetition of a description thereof will be omitted.

FIG. 1 is a block diagram showing a photovoltaic power generation system 7 of an embodiment of the invention. As shown in FIG. 1, this photovoltaic power generation system 7 comprises a first solar cell string 1a which is connected to a backflow prevention diode 31 included in a connection box 3, and includes solar cell modules 8 connected in series, which are solar cell element groups having a plurality of solar cell elements connected to each other, that is, solar cells of a predetermined standard number, and a second solar cell string 1b which is connected to another backflow prevention diode 31 via voltage regulating means 2 and includes solar cell elements of a smaller number than the standard number, connected in series. The first solar cell string 1a and the second solar cell string 1b are connected in parallel. Electric power generated in the respective solar cell strings 1a, 1b is supplied to loads such as an AC load 5 and a commercial electric power system 6 via a power conditioner 4.

In other words, the photovoltaic power generation system 7 comprises the first solar cell string 1a, the second solar cell string 1b, the voltage regulating means 2, the connection box 3 serving as connecting means, and the power conditioner 4 serving as electric power converting means. The respective solar cell strings 1a, 1b are composed of the plural solar cell modules 8 connected to each other. For example, in the first solar cell string 1a, a predetermined standard number of solar cell modules 8 are connected in series. On the other hand, in the second solar cell string 1b, solar cell modules of a smaller number than the standard number are connected in series.

The power conditioner 4 receives DC electric power outputted from the respective solar cell strings 1a, 1b, converts the DC electric power to AC electric power, and regulates a voltage supplied thereto so that the maximum DC electric power is supplied. For example, the power conditioner 4 carries out voltage regulation so that a DC voltage at which the maximum DC electric power is supplied from the standard solar cell string 1a is obtained.

The connection box 3 connects the respective solar cell strings 1a, 1b in parallel, binds output electric power outputted from the respective solar cell strings 1a, 1b, and supplies to the power conditioner 4. Moreover, in the connection box 3, for the purpose of preventing that a current from one of the solar cell strings flows back to the other solar cell string, the backflow prevention diodes 31 are disposed to the respective strings. The backflow diodes 31 are interposed, respectively, on the side of the strings from a connection contact in a connection path that connects the strings in parallel.

The voltage regulating means 2 is interposed in a connection path which electrically connects the second solar cell string 1b and the connection box 3, and disposed on the side of the second solar cell string 1b from the backflow prevention diode 31. The voltage regulating means 2 regulates a supplied DC voltage so that DC electric power supplied from the second solar cell string 1b becomes the maximum, boosts the regulated DC voltage, and supplies the boosted voltage to the power conditioner 4 via the connection box 3.

In general, a solar cell element is a monocrystal solar cell element or a polycrystalline solar cell element made by melting and recrystallizing silicon, or an amorphous solar cell element made by evaporating silicon in an amorphous state on a board, or the like, and in the photovoltaic power generation system 7, any solar cell element may be used. Since, in the case of the aforementioned solar cell element, an output voltage of a single element is only approximately 0.5 V, a plurality of solar cell elements are connected, for example, in series so as to obtain a high voltage in order to obtain an appropriate output voltage for a load to which electric power is supplied. A solar cell string is composed of solar cell element groups connected in series or composed of a plurality of solar cell modules 8 connected to each other, each of which has a plurality of solar cell elements. Although a current is increased by connecting the solar cell strings in parallel, it is impossible, in the case of connecting strings having different output voltages in parallel, to obtain the maximum output electric power as a system because the maximum output electric power points of the respective strings locate on different points as described later. Then, it is desirable to equalize output voltages of the respective solar cell strings connected in parallel.

Further, it is desirable that, in a solar cell string, a predetermined standard number of solar cell modules 8 are connected so that a voltage and a current that allow the power conditioner 4 to efficiently execute electric power conversion can be obtained. Although solar cell elements are connected in series to compose a solar cell string in this embodiment of the invention, solar cell elements may be connected in series and parallel to compose a solar cell string. There is a case where a first solar cell string in which a predetermined standard number of elements are connected so that an output voltage becomes an aimed voltage in this manner is referred to as a standard solar cell string 1a.

Further, there is a case where, because of restriction of an area for installing solar cell elements or the like, a second solar cell string 1b which includes a different number of solar cell elements and has a different capability of electric power generation is placed among a plurality of solar cell strings. There is a case where such a second solar cell string 1b is referred to as a non-standard solar cell string 1b. The non-standard solar cell string 1b may include a smaller number of solar cell elements than the standard solar cell string 1a, or may include a larger number of solar cell elements than the standard solar cell string 1a, and may have a larger capability of electric power generation than the standard solar cell string 1a, or may have a smaller capacity than the standard solar cell string 1a.

In general, in order to prevent that when an output voltage of one solar cell string decreases, an output voltage of another solar cell string decreases together with that, outputs of the respective solar cell strings are connected in parallel via the backflow prevention diodes 31. When an output voltage of the non-standard solar cell string 1b is lower than that of the standard solar cell string 1a, when the non-standard solar cell string 1b is connected directly to the standard solar cell string 1a in parallel, electric power outputted from the non-standard solar cell string 1b is not added as an output because of voltage shortage. Then, by the voltage regulating means 2, an output voltage of the non-standard solar cell string 1b is regulated so as to match with an output voltage of the standard solar cell string 1a. Moreover, when an output voltage of the non-standard solar cell string 1b is higher than that of the standard solar cell string 1a, for the purpose of preventing that an output of the standard solar cell string 1a is not added, voltages are matched with each other as well. The voltage regulating means 2 is classified to a boosting type, a buck type and a polarity reverse type, and a switching regulator that carries out switching control by the use of an inductance and a capacitor is preferable.

Electric power collected in the above manner is supplied to the power conditioner 4. The power conditioner 4 converts the supplied DC electric power to AC electric power, and converts to a voltage and a current phase synchronized with the AC load 5 so as to become usable in the AC load 5 such as a light and motor equipment. For example, at the time of electric power conversion, other than executing electric power supply as an independent power source which can be used only in the AC load 5, by combining safety equipment and an electric power conversion mechanism and achieving electric power system connection to the commercial electric power system 6 provided with electric power supplied from an electric power company, it may be allowed to buy and sell electric power.

Although only one standard solar cell string 1a and only one non-standard solar cell string 1b are shown in FIG. 1, it is needless to say that more solar cell strings can be included. However, when a plurality of standard solar cell strings 1a are included in the photovoltaic power generation system 7, it is desirable that the numbers of solar cell elements connected in series in the respective strings are the same numbers or approximate values that satisfy an allowance of about ±10%, for example. When a plurality of non-standard solar cell strings 1b are included, it is not required that the numbers of solar cell elements connected in series in the respective non-standard solar cell strings are the same numbers.

Figure 2:
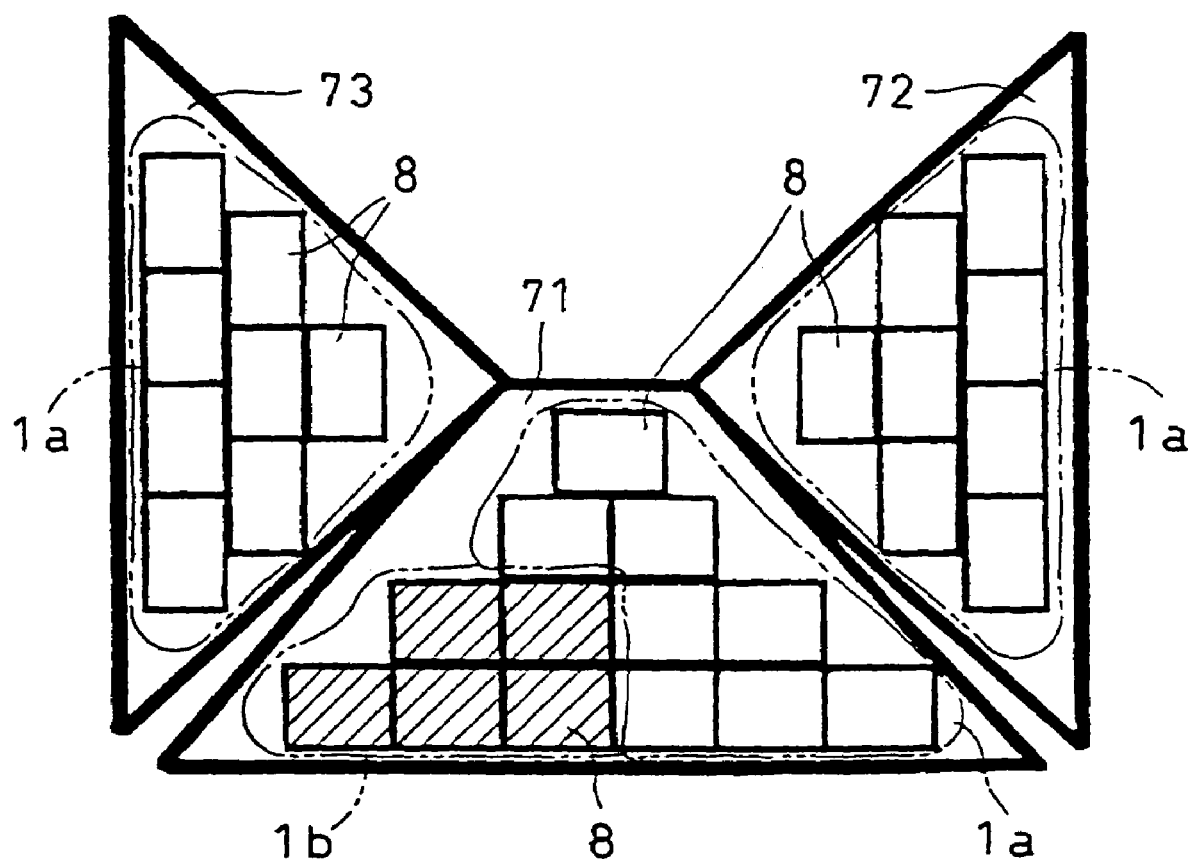
FIG. 2 is a plan view showing an example of placing solar cell modules 8 on roof faces of a house.

FIG. 2 is a plan view showing a state where the solar cell modules 8 are placed on a house. As shown in FIG. 2, in the case of installing a plurality of solar cell modules 8 on a hip roof of a house, a solar cell string having eight solar cell modules 8 connected in series, which is the maximum installable number on a roof face 72 and a roof face 73, becomes the standard solar cell string 1a, for example, as shown in FIG. 2. Moreover, as shown in FIG. 2, a solar cell string having five solar cell modules 8 connected in series placed on a region of a roof face 71 except a region where the standard solar cell string 1a is placed becomes the non-standard solar cell string 1b.

In a conventional photovoltaic power generation system, the same serial number of solar cell strings are connected in parallel in order to obtain an optimum output, so that only eight solar cell modules 8 are installed in actual although there is a space for installing thirteen solar cell modules 8 on the roof face 71, and the installation space cannot be effectively used. In the invention, by the non-standard solar cell string 1b and the voltage regulating means 2, it is possible to not only effectively use a space for installing the solar cell modules 8 as illustrated later but also keep an operation output of the solar cell strings to be the maximum at all times, so that it is possible to install thirteen solar cell modules on the roof face 71, and obtain an optimum output from each solar cell string.

FIG. 3 is a graph that presents output characteristics of the standard and non-standard solar cell strings. In FIG. 3A, the state of output electric power in the case of connecting the two solar cell strings 1a, 1b in parallel having different capabilities of electric power generation. On each of the roof faces 72, 73, the standard string 1a that has eight solar cell modules 8 is placed. Moreover, on the roof face 71, thirteen solar cell modules 8 can be placed, and the standard solar cell string 1a having eight solar cell modules 8 and the non-standard solar cell string 1b having five solar cell modules 8 are placed. Assuming that the standard solar cell string 1a and the non-standard solar cell string 1b are those of FIG. 1, an output electric power curve L presents output electric power from the standard solar cell string 1a, and an output electric power curve S presents output electric power from the non-standard solar cell string 1b. When the respective solar cell strings 1a, 1b are connected in parallel, the result of adding output electric power from the standard solar cell string 1a presented by the output electric power curve L and output electric power from the non-standard solar cell string 1b presented by the output electric power curve S becomes electric power presented by an output electric power curve (L+S). The maximum output operation point, which is a generated electric power point of the highest output in each occasion when the respective solar cell strings 1a, 1b generate electric power, is presented by (α2+β1) in FIG. 3A.

However, an electric power value P(1) at the maximum output operation point (α2+β1) in the case of connecting the solar cell strings 1a, 1b having different voltages in parallel is only twice an electric power value P(S) at the maximum output operation point β1 of the non-standard solar cell string 1b. Therefore, the result of adding the electric power value P(S) at the maximum operation point β1 of the non-standard solar cell string 1b and an electric power value P(L) at the maximum output operation point α1 of the standard solar cell string 1a cannot be obtained, that is, electric power loss is caused.

Further, since a second output electric power point α1 exists in the lower point of the maximum output operation point (α2+β1) in the output electric power curve (L+S), and a valley D of electric power is made between the maximum output operation point (α2+β1) and the operation point α1, such a problem arises that, in maximum power point tracking described later, the power conditioner 4 mistakes the valley D as a slope on the opposite side of the maximum output operation point and carries out a tracking operation assuming that the output operation point α1 is the maximum output operation point. Therefore, in the conventional photovoltaic power generation system, the maximum output cannot be obtained, and moreover, as shown in FIG. 3A, when an operation voltage is found from the maximum electric power point α1 of the output electric power curve L, all that can be used is only electric power P(L) of the standard solar cell string.

On the other hand, an output electric power curve in the photovoltaic power generation system 7 of the invention will be described by the use of FIG. 3B. The output electric power curve L presents output electric power from the standard solar cell string 1a, and an output electric power curve Sc presents output electric power obtained after output electric power from the non-standard solar cell string 1b is boosted by the voltage regulating means 2. As apparent from the graph, a voltage value Vm of the maximum output operation point βc1 of the non-standard solar cell string 1b boosted by the voltage regulating means 2 coincides with a voltage value $V_L$ of the maximum output operation point α1 of the standard solar cell string 1a. Therefore, when the respective solar cell strings 1a, 1b are connected in parallel, it is possible, by adding output electric power from the standard solar cell string 1a presented by the output electric power curve L and output electric power from the non-standard solar cell string 1b presented by the output electric power curve Sc, to obtain output electric power presented by a maximum output electric power curve (L+Sc) obtained by adding the maximum values of the output electric power curve L and the output electric power curve Sc. Consequently, a second output operation point is not made in the lower point of the maximum output operation point (α1+βc1), and an electric power value P(2) of the maximum output operation point (α1+βc1) in the case of connecting the respective solar cell strings 1a, 1b can be the result of adding an electric power value P(Sc) of the non-standard solar cell string 1b and an electric power value P(L) of the output operation point α1 of the standard solar cell string 1a, so that electric power loss is small. Moreover, it is possible to allow the power conditioner 4 to detect the maximum electric power point (α1+βc1) with ease.

As described above, in the photovoltaic power generation system 7 according to the invention, the voltage regulating means 2 is disposed between the non-standard solar cell string 1b and the backflow prevention diode 31, whereby it is possible to obtain the high maximum output electric power P(2) as compared with in the case of merely connecting solar cell strings having different output voltages in parallel, and it is possible to supply the maximum output electric power to the power conditioner. Moreover, this voltage regulating means 2 can be easily attached and detached to and from a connection path that electrically connects the non-standard solar cell string 1b and the connection box 3. For example, it is possible to remove the voltage regulating means when it is possible to change the non-standard solar cell string 1b to the standard solar cell string 1a by expansion of solar cell modules 8 or the like.

Figure 4:
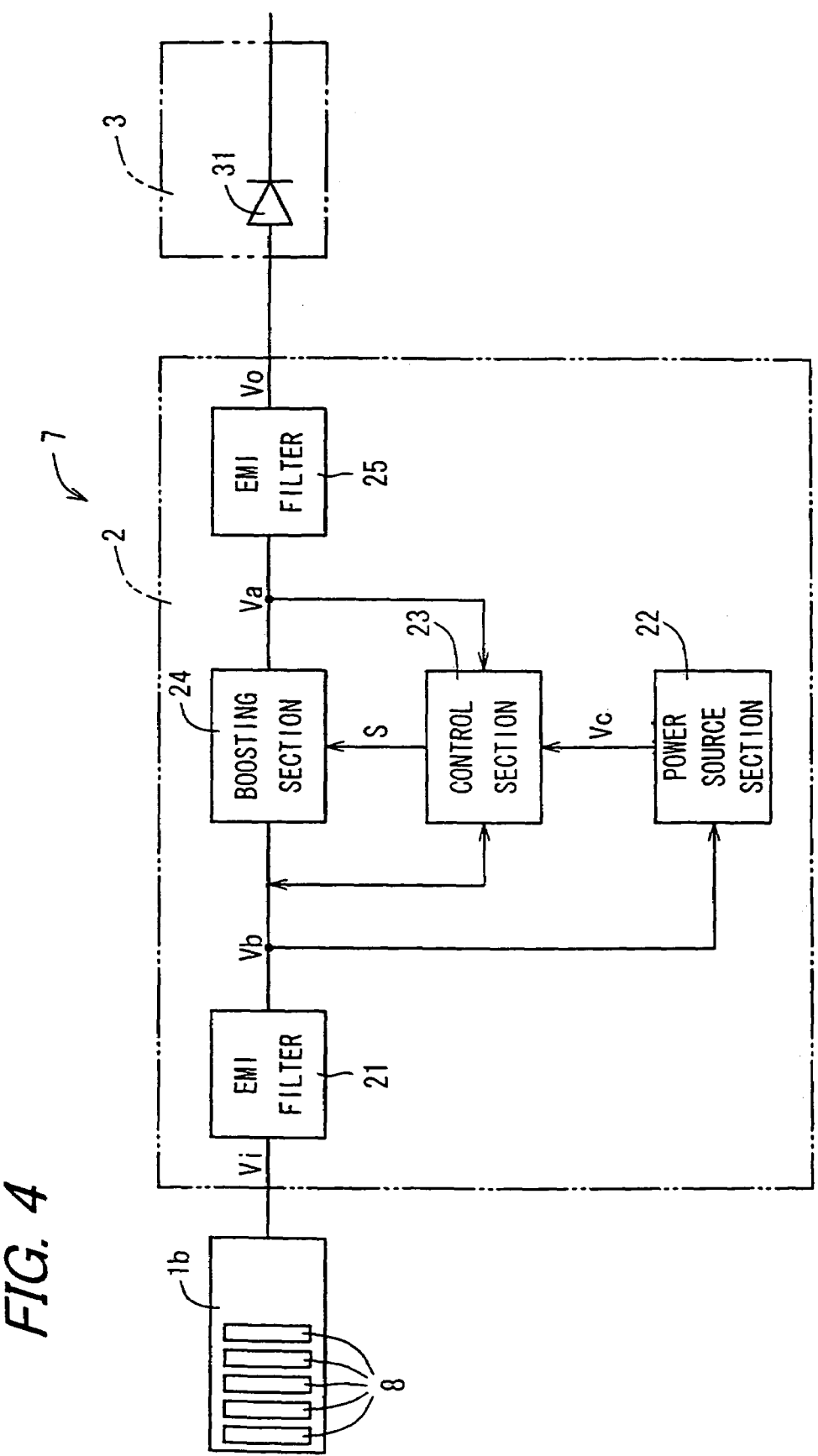
FIG. 4 is a block diagram diagrammatically showing an example of voltage regulating means 2 included in the photovoltaic power generation system 7 of FIG. 1.

FIG. 4 is a block diagram showing the detail of the voltage regulating means 2. As shown in FIG. 4, the voltage regulating means 2 comprises an input EMI (electromagnetic interference) filter 21 and an output EMI filter 25 which protect a circuit from a surge voltage from outside and static electricity, a power source section 22 for obtaining a power source which drives the entire voltage regulating means from output electric power of the non-standard solar cell string 1b, a control section 23 for detecting voltage states of the input side and the output side and detecting the maximum output operation point β1 of the non-standard solar cell string 1b, and a boosting section 24 controlled by the control section 23 to boost a DC voltage outputted from the non-standard solar cell string 1b.

Figure 5:
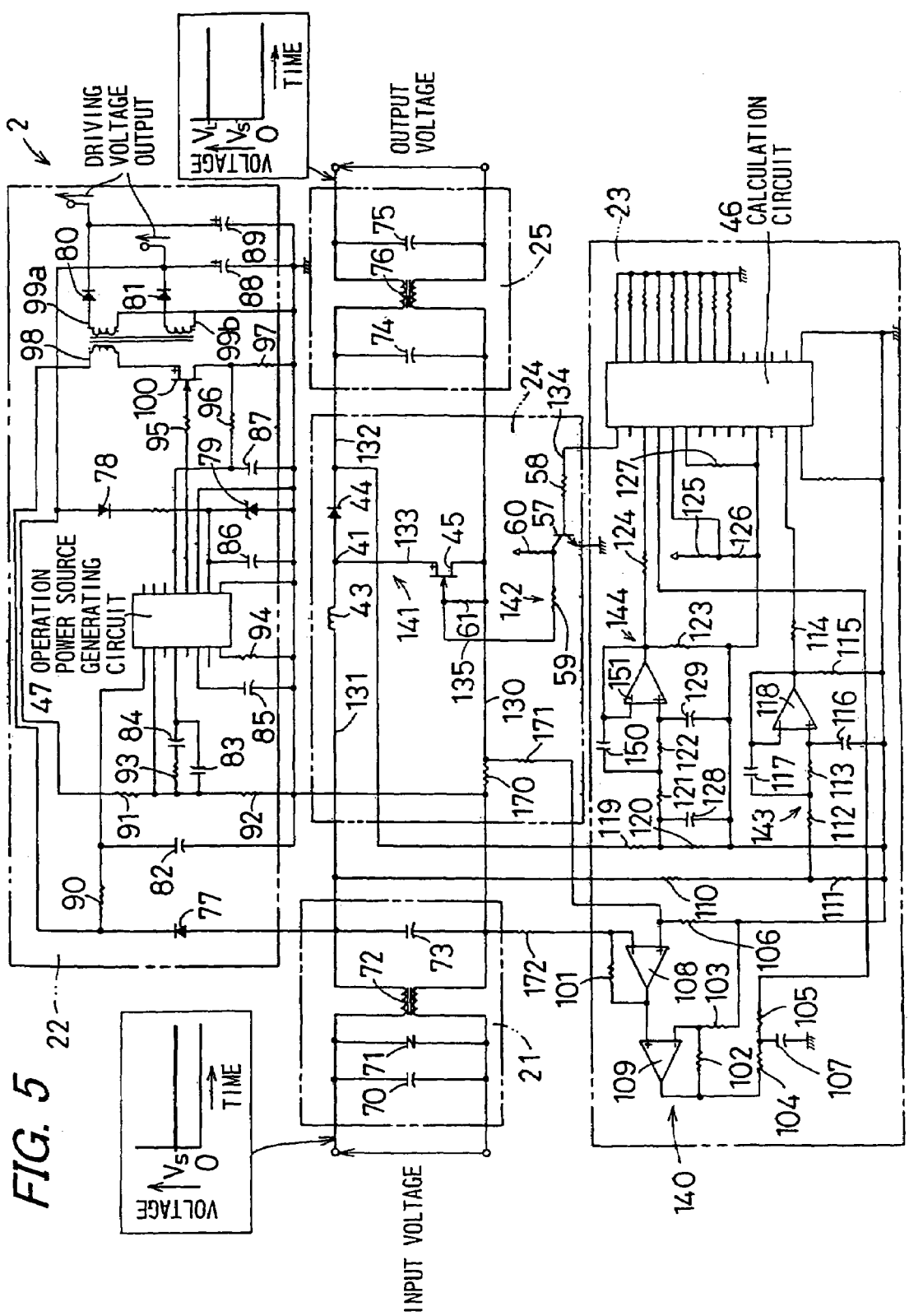
FIG. 5 is a circuit diagram that produces the voltage regulating means 2.

FIG. 5 is a circuit view which produces the voltage regulating means 2. The composition of the voltage regulating means 2 shown in FIG. 5 is one exemplification, and does not restrict a composition. As shown in FIG. 4, a DC voltage Vi outputted from the non-standard solar cell string 1b is supplied to the boosting section 24 via the input EMI filter 21. Regarding DC electric power supplied to the boosting section 24, a voltage is regulated to an optimum voltage Vs of the non-standard solar cell. The boosting section 24 boosts the supplied DC voltage Vi. The boosting section 24 supplies a boosted DC voltage Vo to the electric power converting means 4 via the output EMI filter and via the connection box 3.

Further, the DC voltage Vi outputted from the non-standard solar cell string 1b is also supplied to the power source section 22 via the input EMI filter 21. The power source section 22 generates a driving voltage Vc which is necessary for the control section 23 and the boosting section 24 to operate, and supplies the generated driving voltage Vc to the control section 23.

The control section 23 detects a pre-boosting DC voltage Vb before boosting to be supplied to the boosting section 24 and a post-boosting DC voltage Vc boosted by the boosting section 24, regulates a voltage so that input electric power inputted from the non-standard solar cell string 1b becomes the maximum, and carries out feedback control of boosting ratio. In specific, based on the result of detection, the control section 23 calculates an optimum boosting ratio, which is a value obtained by dividing the post-boosting DC voltage Vb by the pre-boosting DC voltage Va. The control section 23 supplies a boosting ratio control signal S that presents the calculation result to the boosting section 24. The boosting section 24 boosts the pre-boosting DC voltage Vb based on the supplied boosting ratio control signal S.

The boosting section 24 is produced by a chopper circuit which includes an inductor 43, a diode 44 and a switching element 45.

The switching element 45 is realized by a field effect transistor, for example. Because boosting a DC voltage outputted from the non-standard solar cell string 1b in this embodiment, it is realized by a boosting chopper circuit 141. A duty ratio of the switching element 45 in the circuit is regulated by the regulating section 23, whereby the boosting section 24 is capable of regulating an input voltage so that input electric power inputted from the non-standard solar cell string 1b becomes the maximum.

In specific, when input voltages are applied to an installation side line 130 and an input side line 131, the installation side line 130 and the input side line 131 are connected by a connection line 133. The connection line 133 and the input side 132 are connected at a first connection point 41, and the first connection point 41 is connected to an output side line 133. That is to say, the first connection point 41 connects the input side line 131, the output side line 132 and the connection line 133.

In the input side line 131, the inductor 43 is interposed. Moreover, in the output side line 132, the diode 44 for preventing that a current flows from the output side line 132 to the input side line 131 is interposed. Furthermore, in the connection line 133, the switching element 45 is interposed. When the switching element 45 is in the on state, the input side line 131 and the installation line 130 are connected via the connection line 133. On the other hand, when the switching element 45 is in the off state, the input side line 131 and the installation line 130 are not connected via the connection line 133. A switching signal from a calculation circuit 46 is supplied via a signal line 134 to an amplification circuit 142 that includes a transistor 57 and resistors 58 to 61, and amplified by the amplification circuit 142. The amplified switching signal is supplied to the switching element 45 via a switching line 135. When receiving a switching signal from the switching line 135, the switching element 45 switches connection states of the connection line 133 based on the switching signal. Therefore, a boosting ratio is regulated by a duty ratio of a switching signal.

The control section 23 calculates an optimum boosting ratio. The control section 23 generates a boosting ratio control signal S, that is, a switching signal whose pulse width is regulated in accordance with a calculated optimum boosting ratio by the use of a PWM (pulse wide modulation) circuit. An operation signal generated by the PWM circuit is supplied to the amplification circuit. The amplification circuit switches the switching element 45 in accordance with a boosting ratio control signal S supplied from the PWM circuit.

The respective EMI filters 21, 25 have a low frequency pass characteristic, and eliminate high frequency component included in a DC voltage. For example, the input EMI filter 21, 25 is produced by a filter circuit that includes capacitors 70, 71, 73 respectively connected in parallel and an inductor 72. By the input EMI filter 21, it is prevented that a DC voltage including noise is supplied to the boosting section 24. On the other hand, the output EMI filter 25 is produced by a filter circuit that includes capacitors 74, 75 respectively connected in parallel and an inductor 76. By the output EMI filter 25, it is possible to prevent that a DC voltage including noise is supplied to the connection box 3.

The power source section 22 is produced by including diodes 77 to 81, capacitors 82 to 89, resistors 90 to 97, a primary coil 98, secondary coils 99a, 99b and a switching element 100. Electric energy supplied from the non-standard solar cell string 1b is stored in the primary coil 98 as electromagnetic energy, and by switching the switching element 100, it is possible to take out necessary voltages from the secondary coils 99a, 99b as output voltages in a stable manner. A voltage outputted in this manner is supplied to the control section 23 as a driving source for driving the control section 23. Therefore, even when a voltage supplied from the non-standard solar cell string 1b varies, the power source section 22 is capable of generating a necessary power source to drive the control section 23 and supplying a power source to the control section 23 in a stable manner.

The control section 23 has a current detection circuit 140 formed by resistors 101 to 106, 170, 171, 172, a capacitor 107 and operation amplifiers 108, 109 that detects a current flowing through the installation line 130 and supplies a detected current to the amplification circuit 46. In specific, by detecting voltages on both ends of the resistor 170 interposed in the installation line, it is possible to detect a current flowing through the installation line 130.

Further, the control section 23 has an input side detection circuit 143 produced by resistors 111 to 115, capacitors 116, 117 and an operation amplifier 118 that detects a potential difference, that is, a voltage between the input side line 131 and the installation line 130 and supplies a detected input voltage to the calculation circuit 46. Moreover, the control section 23 has an output side circuit 144 produced by resistors 119 to 127, capacitors 128, 129, 150 and an operation amplifier 151 that detects a potential difference, that is, a voltage between the output side line 132 and the installation line 130 and supplies a detected output voltage to the calculation circuit 46. The calculation circuit 46 calculates electric power supplied from the non-standard solar cell string 1b based on an input voltage, an output voltage and a current flowing through the installation line that are supplied thereto. Moreover, it changes an amplification rate of the chopper circuit 24, generates a switching signal corresponding to a duty ratio responsive to the amplification rate, and supplies to the signal line 134. Then, the control section 23 examines an amplification rate that electric power supplied from the non-standard solar cell string 1b becomes the maximum.

Figure 6:
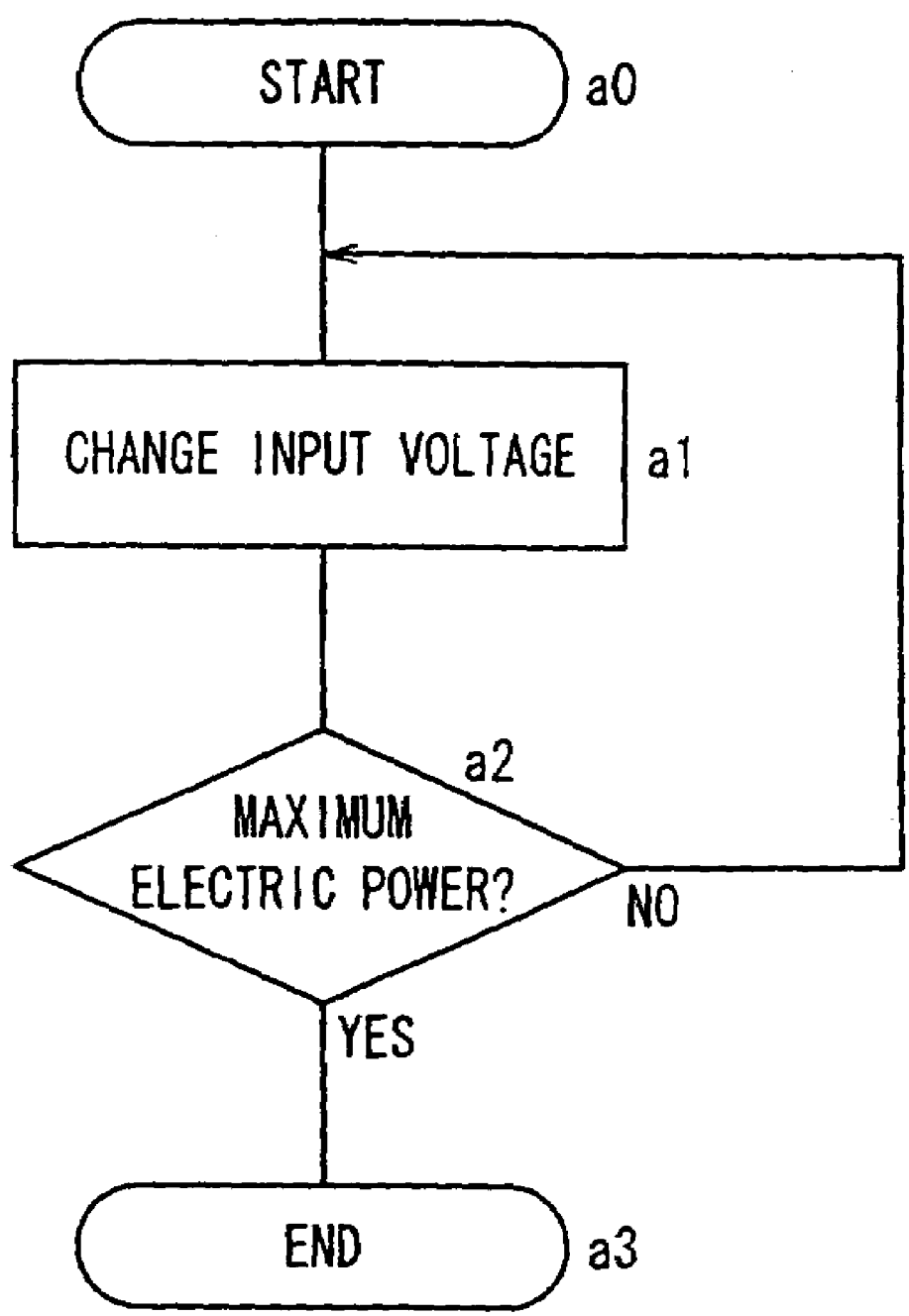
FIG. 6 is a flowchart showing a boosting control operation of a control section 23.

FIG. 6 is a flowchart showing a boosting control operation of the control section 23. At first, when provided with a driving voltage Vc from the power source section 22 and ready for controlling the boosting section 24 at step a0, the control section 23 starts the boosting control operation at step a1.

At step a1, the control section 23 carries out maximum power point tracking control. That is to say, the control section 23 alters a boosting ratio, increases or decreases a DC current outputted from the non-standard solar cell string 1b, and changes a DC voltage. Then, the operation goes to step a2. At step a2, it sequentially measures DC electric power outputted from the non-standard solar cell string 1b at the time of change. Then, it detects an operation point that DC electric power becomes the maximum. That is to say, it detects an optimum voltage Vs that electric power outputted from the non-standard solar cell string 1b becomes the maximum as shown in FIG. 3A, and the operation goes to step a3. At step a3, the operation is ended.

Figure 7:
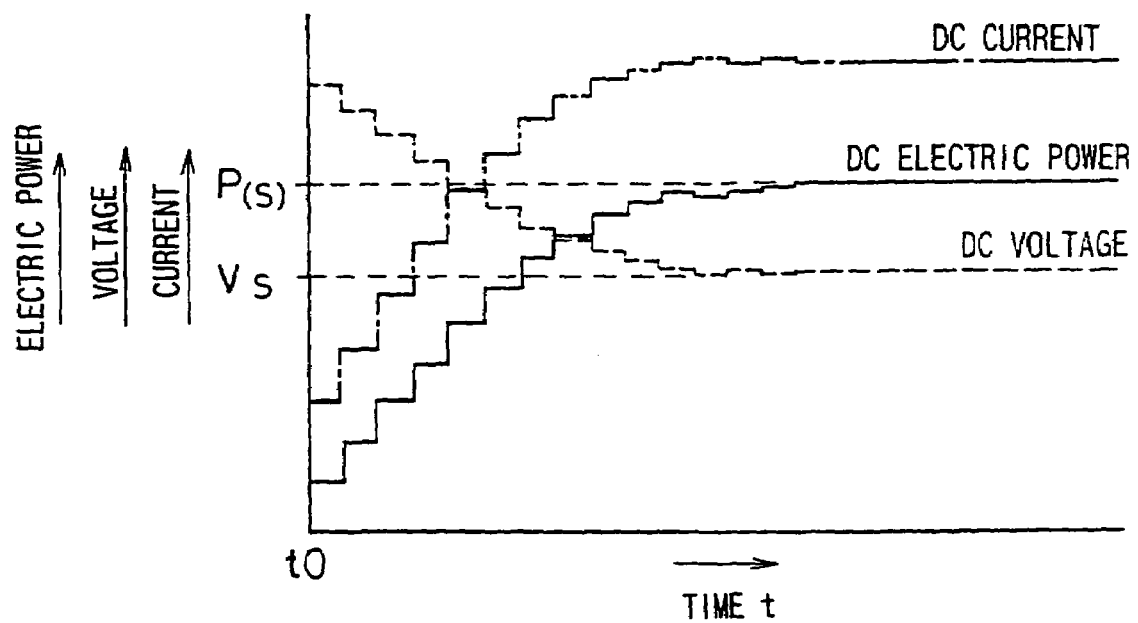
FIG. 7 is a graph for describing maximum power point tracking control of the control section 23.

FIG. 7 is a graph for describing maximum power point tracking control. In a solar cell string, a short-circuit current changes as the amount of insolation changes, and an open-circuit voltage changes as a temperature changes. Therefore, DC electric power outputted from the solar cell string varies every moment. It is necessary to detect an operation point of the maximum electric power at all times.

For example, the control section 23 has the calculation circuit 46 produced by an integration circuit or the like. The calculation circuit 46 detects a DC voltage and a DC current outputted and supplied from the non-standard solar cell string 1b, and calculates DC electric power thereby.

Next, the calculation circuit 46 changes a DC voltage supplied from the non-standard solar cell string 1b by a predetermined voltage value of one step, and calculates DC electric power at the moment again.

For example, the calculation circuit 46 sets so that a minute output current $I_0$ is supplied from the non-standard solar cell string 1b when detection is started. The calculation circuit 46 compares present DC electric power with previous DC electric power. Next, when present DC electric power is on the rise with respect to previous DC electric power, a DC voltage supplied from the non-standard solar cell string 1b is lowered so that a present DC voltage becomes lower for one step. On the other hand, when present DC electric power is on the decline with respect to previous DC electric power, a DC voltage supplied from the non-standard solar cell string 1b is raised so that a present DC voltage becomes higher for one step.

Such an operation is repeatedly carried out, whereby a voltage and a current that supplied DC electric power becomes the maximum is automatically detected. Since this operation is carried out at all times, it is possible to automatically track in order to operate at the maximum point of electric power supplied from the non-standard solar cell string 1b even when sunlight is blocked by a cloud and the like or the weather changes. The optimum voltage Vs that electric power supplied from the non-standard solar cell string 1b becomes the maximum is found in this manner.

By the power conditioner 4, a load of the voltage regulating means 2 is regulated to a voltage that electric power outputted from the standard solar cell string 1a becomes the maximum. For example, when a voltage supplied from the standard solar cell string 1a to the power conditioner 4 is set to 300 V, even when a voltage outputted from the voltage regulating means 2 is 300 V or more, a voltage lowered to 300 V is supplied from the voltage regulating means 2 to the power conditioner 4.

As a result that a voltage outputted from the voltage regulating means 2 is thus lowered, a DC voltage supplied from the non-standard solar cell string 1b to the voltage regulating means 2 also changes. By executing MPPT control, the voltage regulating means 2 changes and resets a DC voltage supplied from the non-standard solar cell string 1b so that the maximum electric power is supplied based on the changed DC voltage. Consequently, the voltage regulating means 2 is allowed to set an input voltage supplied from the non-standard solar cell string 1b after outputting at a conversion voltage Vm of the power conditioner 4 so that the maximum electric power is supplied from the non-standard solar cell string 1b.

In this embodiment, in a state where an input voltage is regulated so that input electric power inputted from the non-standard solar cell string 1b becomes the maximum, electric power is supplied from the voltage regulating means 2 to the power conditioner 4. When, at this moment, a voltage supplied from the voltage regulating means 2 to the power conditioner 4 is lower than an optimum voltage Vm of the power conditioner 4, that is, an optimum voltage Vl of the standard solar cell string 1a, what the non-standard solar cell string 1b contributes to electric power generation is small, electric power from the non-standard solar cell string 1b is not supplied to the power conditioner 4.

Figure 8:
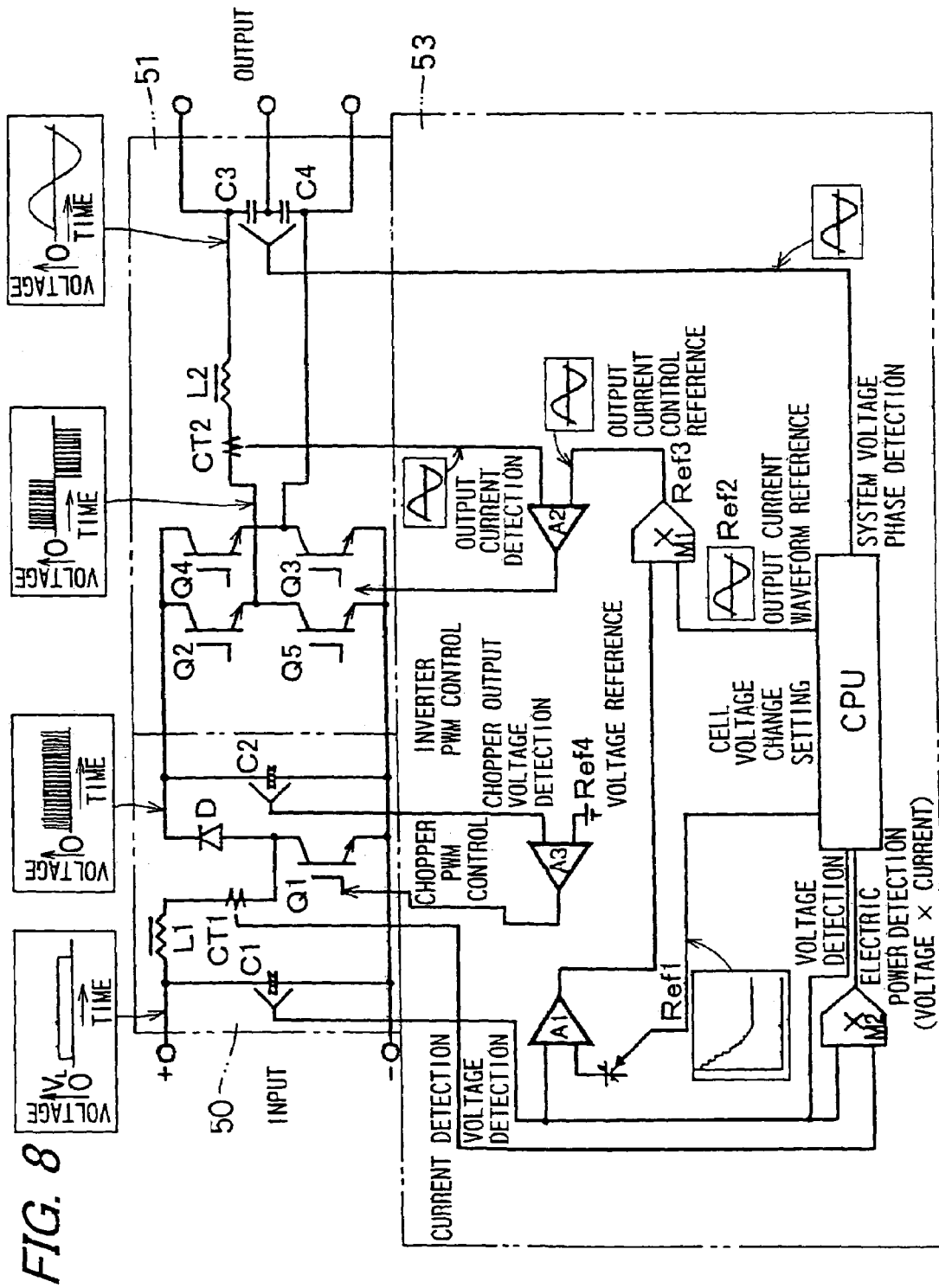
FIG. 8 is a circuit diagram that produces the power conditioner 4.

FIG. 8 is a circuit view producing the power conditioner 4. The composition of the power conditioner 4 is exemplified in FIG. 8, and not restricted to this composition. As the power conditioner 4, a transformerless-type one is used, for example. The power conditioner includes a boosting chopper circuit 50, a PWM inverter circuit 51, and a control circuit 53. The boosting chopper circuit is produced by including capacitors C1, C2, an inductor L1, a switching element Q1, and a diode D. Moreover, the inverter circuit 51 is produced by including switching elements Q2 to Q5, an inductor L2, and capacitors C3, C4. Furthermore, the control circuit 53 is produced by including comparison amplifiers A1, A2, A3 produced by operation amplifiers or the like, multipliers M1, M2, and a CPU (central processing unit).

DC electric power supplied from the standard solar cell string 1a and DC electric power supplied from the voltage regulating means 2 are summed in the connection box 3. The summed electric power is supplied to the power conditioner 4. The boosting chopper circuit 50 receives a DC voltage from the connection box 3, boosts the supplied DC voltage, and supplies to the inverter circuit 51. The inverter circuit 51 converts the supplied DC voltage to an AC voltage, and outputs the converted AC voltage.

The control circuit 53 carries out maximum power point tracking control, and regulates an output current outputted from the power conditioner so as to become a conversion voltage Vm that electric power supplied from the connection box 3 becomes the maximum. Moreover, the power conditioner 4 carries out PWM control of the inverter circuit 51 to convert supplied DC electric power to AC electric power in accordance with increase and decrease of the conversion voltage Vm.

Describing the detail of maximum power point tracking control, in the control circuit 53, to the comparison amplifier A1, a voltage from the connection box 3 and a voltage change setting signal Ref1 outputted from the CPU are inputted. Regarding the voltage change setting signal Ref1, the CPU gradually makes the reference value descend considering the detected summed voltage supplied from the connection box 3 as an initial value. Moreover, the control circuit 53 sets so that an output current of the power conditioner becomes a minute value when the power conditioner starts operating. In accordance with descent of the reference value, the comparison amplifier A1 generates a comparison error signal presenting a deviation between the voltage from the connection box 3 and the voltage change setting signal Ref1, and inputs to the multiplier M1.

The CPU detects a phase of a voltage after conversion to an AC voltage, generates a sinusoidal signal which matches with the phase, and gives the signal to the multiplier M1 as an output current waveform reference signal Ref2. The multiplier M1 multiplies the two signals, and outputs. A signal outputted from the multiplier M1 is given to one side of the comparison amplifier A2 as an output current control reference signal Ref3. Moreover, to the other side of the comparison amplifier A2, an output current detection signal that presents an output current of the power conditioner is given. The comparison amplifier A2 compares the two inputs, converts to an inverter PWM control signal, and outputs, whereby an inverter switching element is driven.

In a control loop described above, the multiplier M2 detects a current and a voltage supplied from the connection box 3, and the electric power is calculated and inputted to the CPU. The CPU reads electric power supplied from the connection box 3, and outputs the voltage change setting signal Ref1. Subsequently, the value of the voltage change setting signal Ref1 is changed for one step, and electric power supplied from the connection box 3 is read again. By thus comparing previous electric power with present electric power and changing an output current outputted from the power conditioner, an operation point that electric power supplied from the connection box 3 becomes the maximum is detected.

This power conditioner is one exemplification of the invention, and as long as carries out maximum power point tracking control and has a function of converting DC to AC, the power conditioner may have another composition.

When a voltage is supplied via the connection box 3 from the standard solar cell string 1a earlier than the non-standard solar cell string 1b, the power conditioner 4 regulates so that the optimum voltage Vl of the standard solar cell string 1a is supplied to the power conditioner 4. That is to say, the conversion voltage Vm coincides with the optimum voltage Vl of the standard solar cell string 1a.

When a voltage is supplied from the non-standard solar cell string 1b via the connection box 3 in this state, a DC voltage boosted by the voltage regulating means 2 so that the optimum voltage Vs of the non-standard solar cell string 1b becomes equal to the conversion voltage Vm is supplied to the power conditioner 4. Since the conversion voltage Vm is equal to the optimum voltage Vl of the standard solar cell string 1a, the power conditioner 4 is provided with both the optimum voltage Vl of the standard solar cell string 1a and a voltage obtained by boosting the optimum voltage Vs of the non-standard solar cell string 1b up to a voltage of the solar cell string 1a. That is to say, the power conditioner 4 is capable of converting to AC electric power at the maximum DC electric power P(2) shown in FIG. 3B.

In this manner, the voltage regulating means 2 carries out MPPT control by the control section 23, and is capable of operating at the maximum output point β1 of the non-standard solar cell string 1b connected thereto, and therefore, it is possible to obtain the maximum output electric power of the non-standard solar cell string 1b connected thereto. Moreover, a voltage of the output side of the voltage regulating means 2 is free, that is, there is no need to control an output voltage, and is equal to an output voltage of the non-standard solar cell string 1b, which is a control voltage of the power conditioner 4. A boosting ratio, which is a ratio between an input voltage supplied from the non-standard solar cell string 1b and an output voltage obtained by boosting the input voltage and supplied to the power conditioner defined in this manner, is automatically regulated. That is to say, there is no need to set a boosting ratio at the time of installation, it is possible to reduce the man-hours of installation, and it is possible to eliminate an operation failure due to wrong setting.

When installation orientations of the respective solar cell strings are different, there is a case where a difference is made in operation points for obtaining the maximum outputs as the respective solar cell strings because of differences in conditions of insolation to solar cell modules composing solar cell strings and conditions of module temperatures. However, since an MPPT control function of the voltage regulating means 2 matches the maximum output points of the respective solar cell strings and enables an operation at the maximum output point, the true maximum output electric power, that is, the maximum electric power with no deviation in an output characteristic of a solar cell can be obtained, and therefore, it is possible to reduce loss of output electric power and obtain higher output electric power.

Further, by using energy from the non-standard solar cell string 1b connected to the voltage regulating means 2 itself as driving energy thereof, only in the daytime that the non-standard solar cell string 1b operates, the voltage regulating means 2 operates together, and is automatically stopped in the nighttime, so that it is possible to avoid needless consumption of electric power.

A time period of feed back in each control of the power conditioner 4 and the voltage regulating means 2 can be arbitrarily set, and it is programmed to, for example, a few seconds to several tens of seconds. Consequently, even when the insolation amount and a temperature change, it is possible to convert to AC electric power at the maximum electric power of the respective solar cell strings.

Further, when necessary electric power is large, there is a case of connecting the power conditioners 4 in parallel. For example, when the maximum output of the power conditioner 4 is 5 kW, in order to obtain output electric power of 6 kW, a first power conditioner 4 capable of outputting electric power of 5 kW and a second power conditioner 4 capable of outputting electric power of 1 kW are connected in parallel. Or, a first power conditioner 4 capable of outputting electric power of 3 kW and a second power conditioner 4 capable of outputting electric power of 3 kW may be connected in parallel.

The power conditioner 4 has a function of achieving system linkage by adapting an output voltage regulated to the optimum output and the phase thereof to a commercial power source. When the respective power conditioners are connected to each other in parallel and solar cell strings having different capabilities of electric power generation are connected to the input sides of the power conditioners 4, it is possible to further increase a capability of electric power generation by disposing the voltage regulating means 2.

Figure 9:
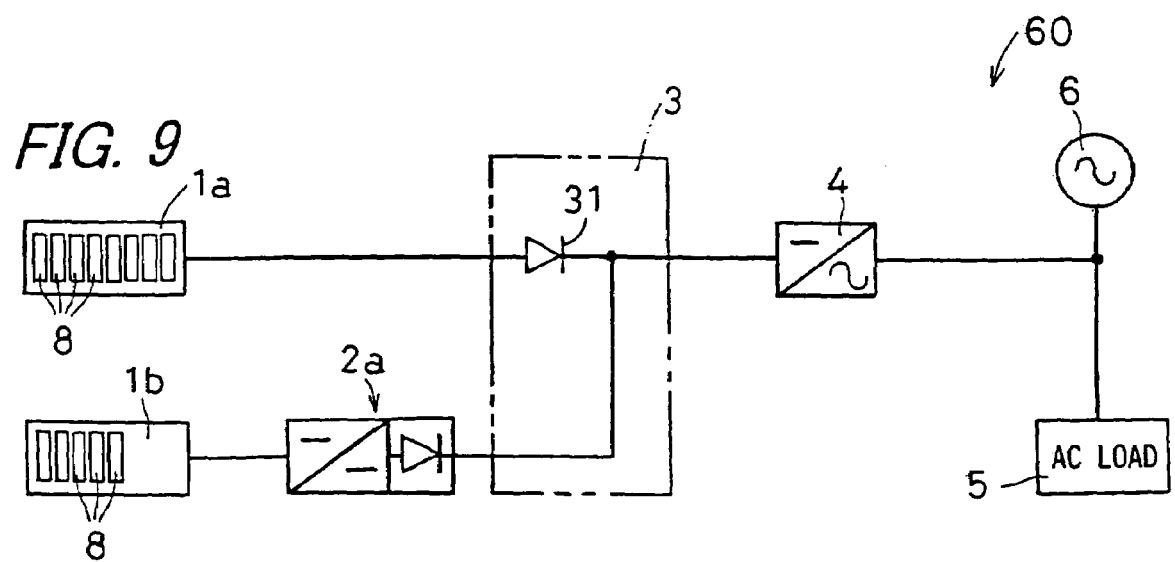
FIG. 9 is a schematic block diagram for diagrammatically describing a photovoltaic power generation system 60 of another embodiment of the invention.

FIG. 9 is a block diagram showing a photovoltaic power generation system 60 of another embodiment of the invention. The photovoltaic power generation system 60 is made by modifying the photovoltaic power generation system 7 shown in FIG. 1 by eliminating the backflow prevention diode 31 inside the connection box 3 responsive to the non-standard solar cell string 1b and disposing a backflow prevention diode to the output side of voltage regulating means 2a. Consequently, it is possible to monitor input and output voltages of the standard solar cell string 1a by the voltage regulating means 2a, so that by the use of this voltage information, before the photovoltaic power generation system is actuated, by monitoring an open-circuit voltage of the non-standard solar cell string 1b at the input side of the voltage regulating means 2a and, on the other hand, monitoring an open-circuit voltage of the standard solar cell string 1a at the output side of the voltage regulating means 2a, a boosting ratio may be set based on input and output voltages. The rest of the composition is the same as that of the photovoltaic power generation system 7 shown in FIG. 1, and the description of the same composition will be omitted.

Figure 10:
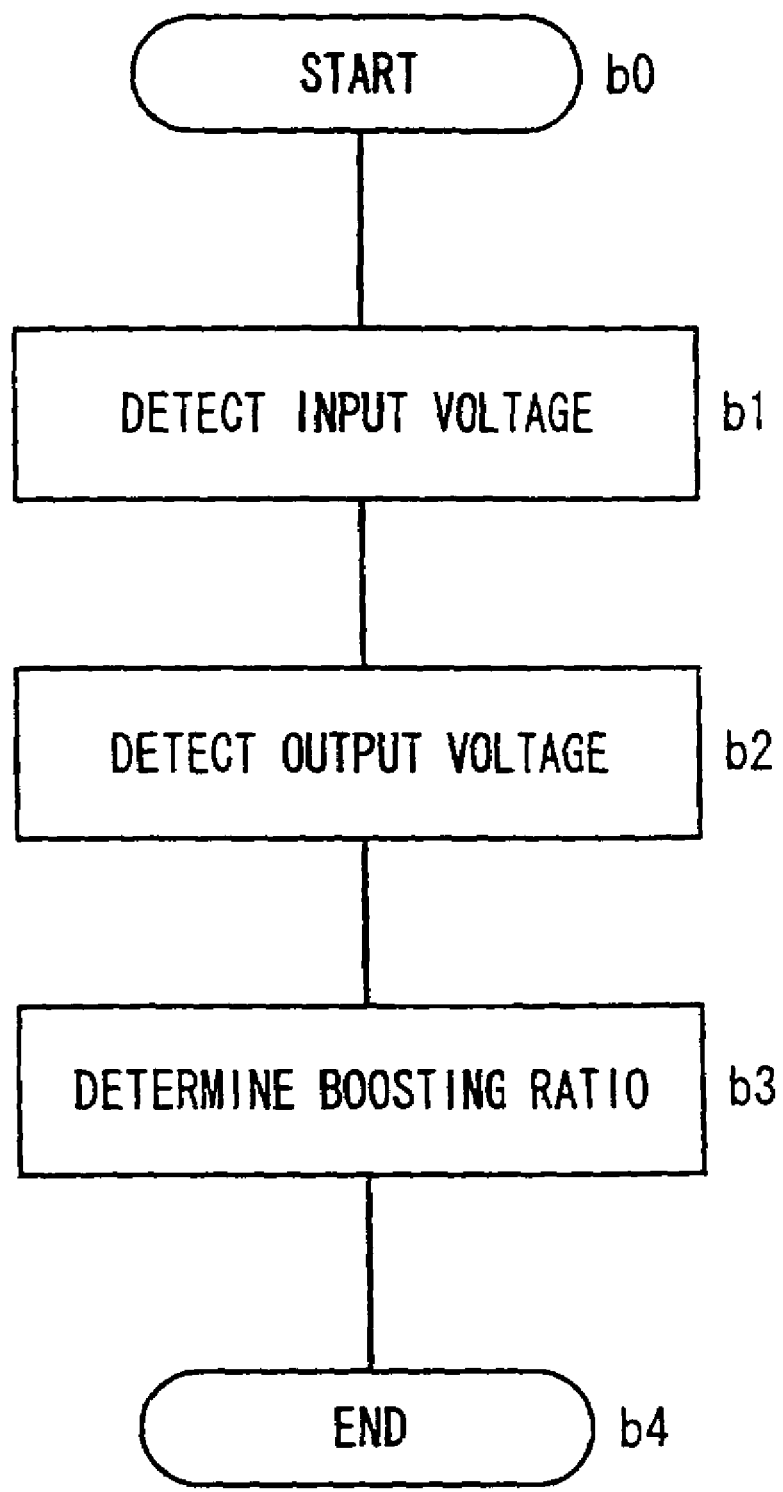
FIG. 10 is a flowchart showing a boosting control operation of the control section 23 of the photovoltaic power generation system 60 shown in FIG. 9.

FIG. 10 is a flowchart showing a boosting control operation of the control section 23 of the photovoltaic power generation system 60 shown in FIG. 9. The control section 23 of the photovoltaic power generation system 60 operates at step b0 and step b1 in the same manner as at the step a0 described before, and the operation goes to step b1.

At step b1, a voltage supplied from the non-standard solar cell string 1b is detected. In other words, a voltage in a connection path on the side of the non-standard solar cell string 1b from the voltage regulating means 2a is detected. Then, the operation goes to step b2. At step b2, a voltage in a connection path on the side of the connection box 3 from the backflow prevention diode 31 disposed to the voltage regulating means 2a is detected. This voltage is the conversion voltage Vm, and regulated to the optimum voltage Vl of the standard solar cell string 1a by the power conditioner 4. In this manner, the control section 23 acquires the optimum voltage Vl of the standard solar cell string 1a and the optimum voltage Vs of the non-standard solar cell string 1b, and the operation goes to step b3.

At step b3, a boosting ratio which is a value obtained by dividing the optimum voltage Vl of the standard solar cell string 1a by the optimum voltage Vs of the non-standard solar cell string 1b is determined. Next, the DC voltage Vi supplied from the non-standard solar cell string 1b is boosted in accordance with the boosting ratio found at step b3 and converted to the optimum voltage Vl of the standard solar cell string 1a, and the operation goes to step b4, where the boosting control operation is ended. As described above, by boosting a voltage supplied from the non-standard solar cell string 1b with an optimum boosting ratio without executing MPPT control, a voltage supplied from the voltage regulating means 2a to the power conditioner 4 may be regulated so as to become close to the optimum voltage Vl of the standard solar cell string 1a.

Further, when a backflow prevention diode is disposed to the connection box 3, the control section 23 may detect whether a DC current flows from the boosting section 24 to the connection box 3 while changing a boosting ratio without executing MPPT control. Then, until a DC current flows, a boosting ratio is changed. When a current flows from the boosting section 24 to the connection box 3, a voltage boosted and outputted by the boosting section 24 and the optimum voltage Vl outputted from the standard solar cell string 1a becomes equal. In this manner, a voltage of the non-standard solar cell string 1b may be boosted and supplied to the power conditioner 4.

Figure 11:
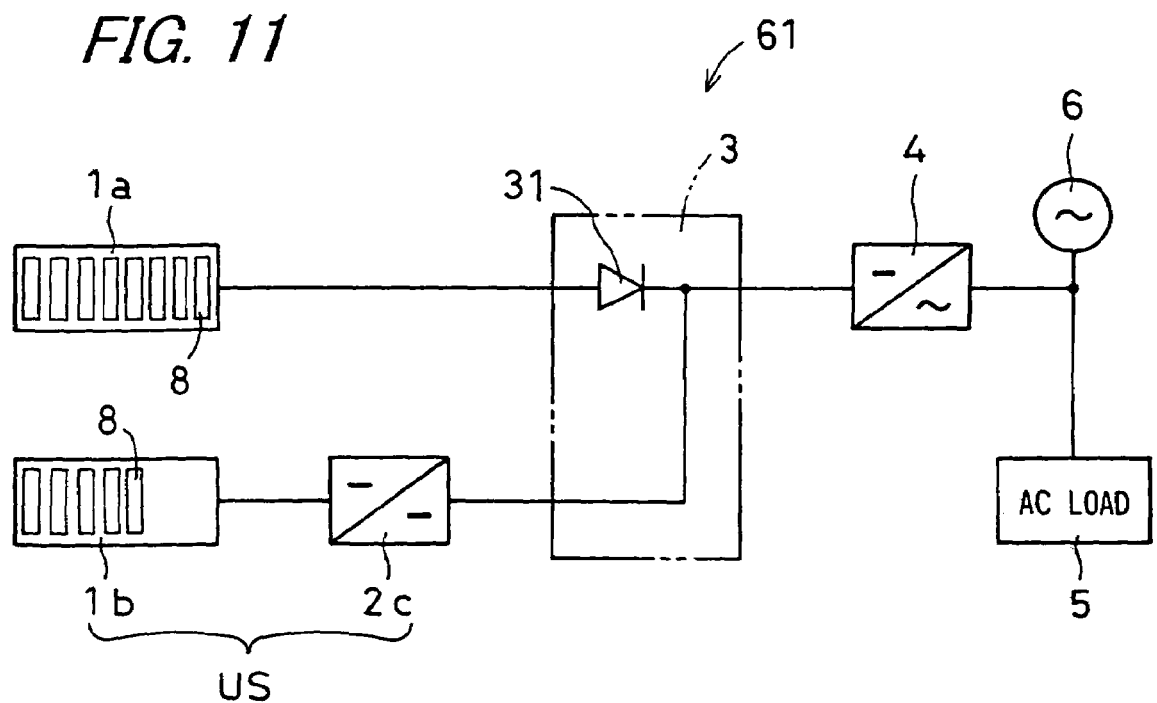
FIG. 11 is a schematic block diagram for diagrammatically describing a photovoltaic power generation system 61 of still another embodiment of the invention

FIG. 11 is a block diagram showing a photovoltaic power generation system 61 of still another embodiment of the invention. The photovoltaic power generation system 61 is made by modifying the photovoltaic power generation system 7 shown in FIG. 1 by eliminating the backflow prevention diode 31 of the connection box 3 responsive to the non-standard solar cell string 1b. The rest of the composition is the same as that of the photovoltaic power generation system 7 shown in FIG. 1, and the description of the same composition will be omitted. Moreover, an operation of voltage regulating means 2c is different from that of the photovoltaic power generation system shown in FIG. 1.

Because the input side of the voltage regulating means 2c carries out MPPT (maximum power point tracking) control to increase the efficiency of electric power generation by driving the boosting section 24 by the control section 23 and detecting and tracking an operation point β1 to become the maximum output on each occasion of the non-standard solar cell string 1b, it is allowed to operate at the maximum output point β1 of the non-standard solar cell string 1b connected thereto, and therefore, it is possible to obtain the maximum output P(S) of the non-standard solar cell string 1b connected thereto. Although the optimum voltage Vs for this maximum output electric power P(S) is boosted by the boosting section 24, when the standard solar cell string 1a and the non-standard solar cell string 1b are connected in parallel, even if a voltage of the non-standard solar cell string 1b that the upper limit of an output voltage is not defined is 250 V at first, an output voltage of the non-standard solar cell string 1b that a solar cell capacity is small (and therefore, needs to be boosted), when an output voltage of the standard solar cell string 1a is 200 V, descends down to almost the same voltage by the electric power capacity. Accordingly, there is no need to monitor an output of the boosting section 24 of the voltage regulating means 2c, a voltage of the output side of the voltage regulating means 2c becomes free, that is, there is no need to control an output voltage, and the voltage becomes equal to the optimum voltage V1 of the standard solar cell string 1a, that is a control voltage of the power conditioner 4. By an input voltage supplied from the non-standard solar cell string 1b to the voltage regulating means 2c and an output voltage to become a voltage of the output side of the voltage regulating means 2c defined in this manner, a boosting ratio is automatically regulated. That is to say, since a builder does not need to set a boosting ratio at the time of installation, it is possible to reduce the man-hours of installation, and it is possible to eliminate an operation failure due to wrong setting. However, since a range of good efficiency referred to as an optimum operation voltage range is often set in the power conditioner 4 and there is a case that equipment is broken when a voltage exceeds this range, it is general to monitor a voltage of the output side by the control section 23 so that an output voltage of the boosting section 24 does not exceed a predetermined range.

Figure 12A:
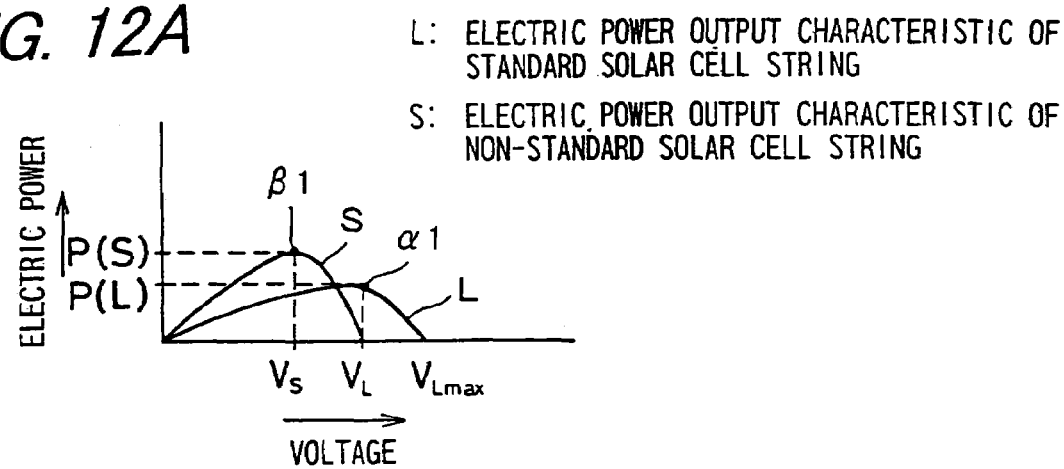
FIGS. 12A to 12C are graphs for describing electric power supplied to a power conditioner.
Figure 12B:
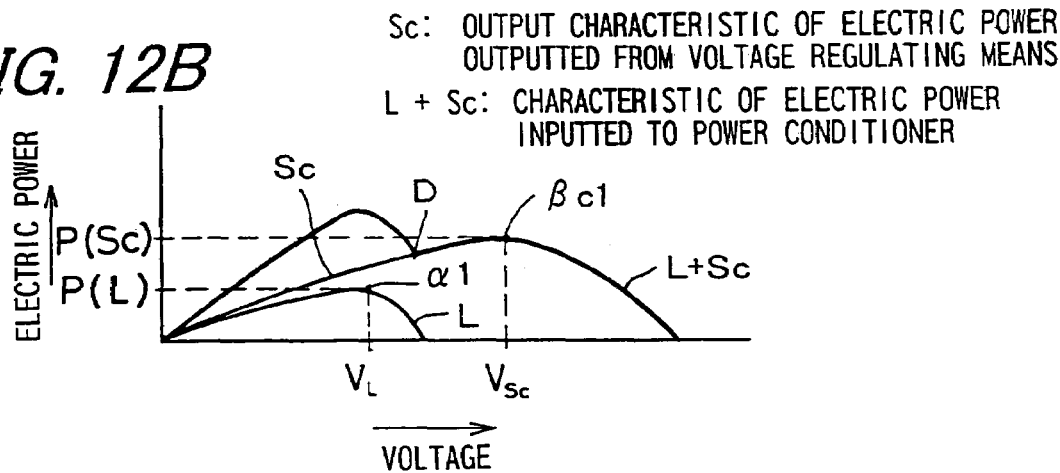
Figure 12C:
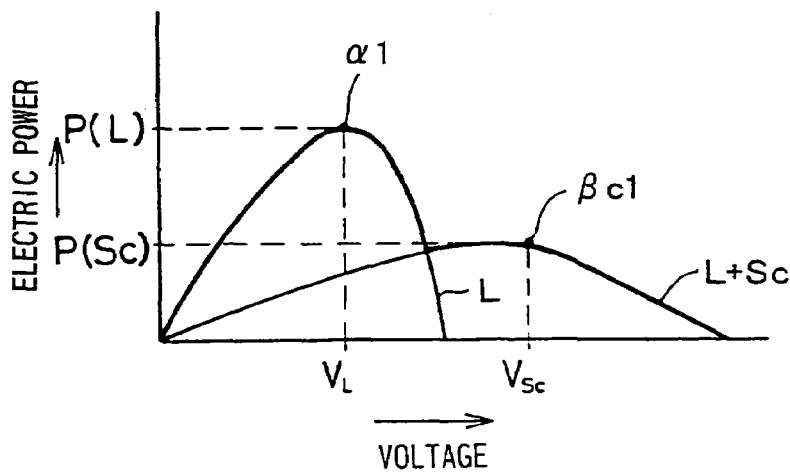

FIG. 12 is a graph for describing an operation of a photovoltaic power generation system. When the non-standard solar cell string 1b begins electric power generation earlier than the standard solar cell string 1a at the time of activation of the photovoltaic power generation system 61, for example, in the morning, the maximum output electric power P(S) of the non-standard solar cell string 1b becomes larger than that of the standard solar cell string 1a as shown in FIG. 12A. The voltage regulating means 2c boosts a voltage of the non-standard solar cell string 1b and supplies to the power conditioner 4. As shown in FIG. 12B, since the power conditioner 4 is not actuated because generated electric power of the standard solar cell string 1a is not enough to be supplied to the load side and electric power cannot be supplied to the load, there is a possibility that an output voltage of the voltage regulating means 2c continuously rises after exceeding an open-circuit voltage $V_{Lmax}$ of the standard solar cell string 1a by an MPPT operation of the voltage regulating means. When generated electric power from the standard solar cell string 1a rises enough to be supplied to the load side in this state as shown in FIG. 12C, when the power conditioner 4 activates and begins an MPPT operation, the power conditioner 4 mistakenly sets a value around an input voltage Vsc supplied from the voltage regulating means 2c at the time point as the maximum output operation point βc1, and there is a possibility of causing a state of stably operating at the mistakenly set maximum output operation point βc1 after that even if electric power at the maximum output operation point α1 of the standard solar cell string 1a becomes higher than electric power at the maximum output operation point βc1 mistakenly set previously, and since system linkage of generated electric power of the standard solar cell string 1a is not achieved on this occasion, the photovoltaic power generation system operates in a state where electric power loss is extremely large.

In order to break such a situation, in this embodiment, the open-circuit voltage $V_{Lmax}$ of the standard solar cell string 1a is detected on the output side of the voltage regulating means 2c before a boosting operation is started by the voltage regulating means 2c, and the boosting operation is controlled so that a voltage does not exceed the voltage.

A specific method thereof is to, before stating a boosting operation, detect a voltage of the standard solar cell string 1a and store in the control section 23 or the like and set a boosting upper limit voltage of the boosting section 24. A voltage of the standard solar cell string 1a at the time of defining the boosting upper limit voltage may be stored in advance, for example, at the time of factory shipment, or an output on the previous day may be referred to. Moreover, by taking a sample periodically, the boosting upper limit voltage may be gradually increased. When an output voltage of the boosting section 24 exceeds the boosting upper limit voltage, by stopping MPPT control of the input side, and switching to output voltage constant control of fixing a voltage at a voltage equal to or less than the predetermined boosting upper limit voltage, it is possible to restrict a voltage increase up to a voltage of the standard solar cell string 1a. Then, by switching from control of the boosting section 24 back to MPPT control of the input side when an output voltage of the standard solar cell string 1a rises up to the boosting upper limit voltage or more, it is possible-to execute optimum control with small electric power generation loss at the time of using the voltage regulating means 2c having an automatic boosting function.

Figure 13:
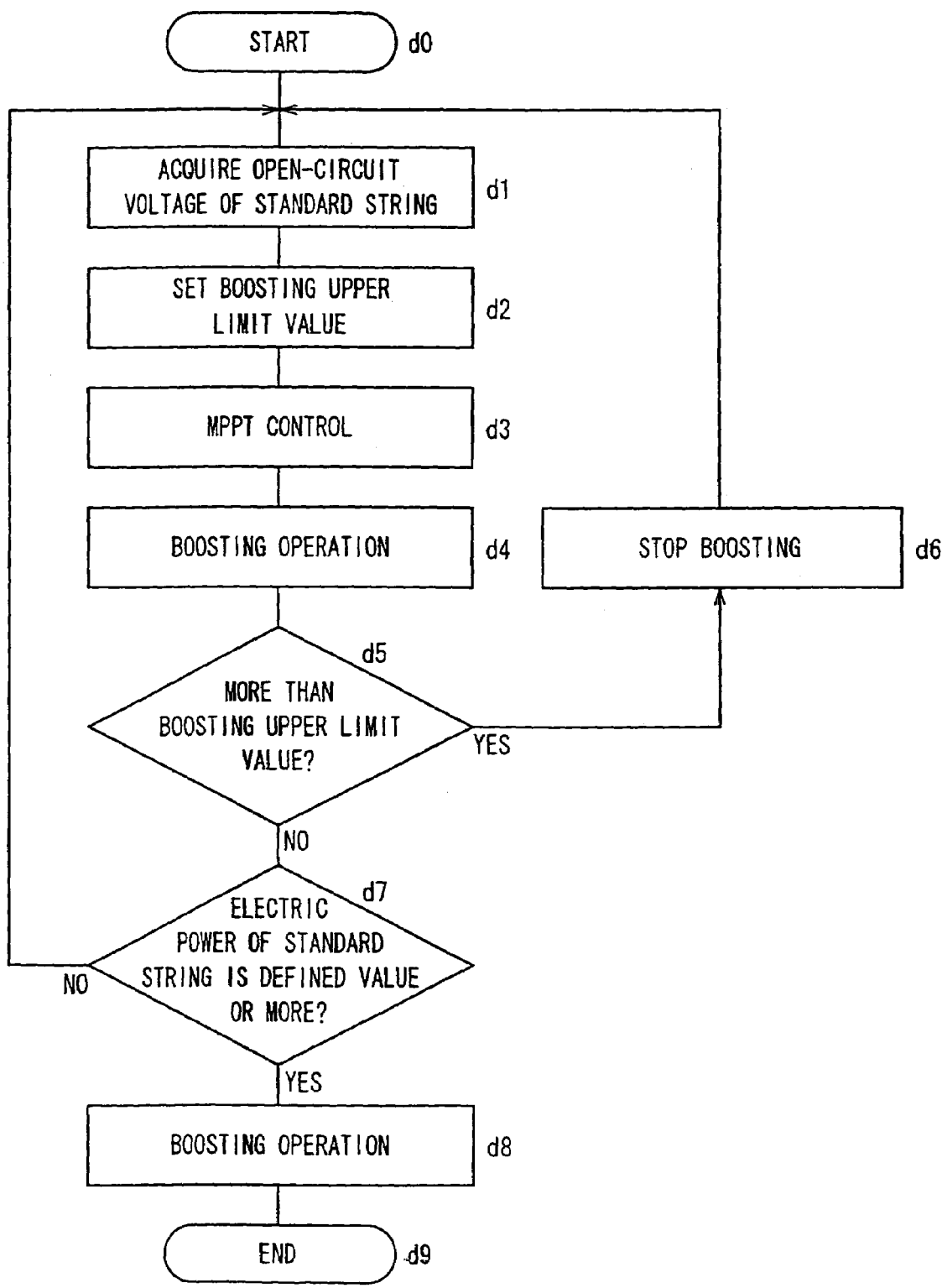
FIG. 13 is a flowchart showing a boosting control operation of the control section 23 of the photovoltaic power generation system 61 shown in FIG. 11.

FIG. 13 is a flowchart showing a boosting operation of the control section 23 of the photovoltaic power generation system 61 shown in FIG. 11. Firstly, at step d0, the control section 23 is provided with a driving voltage Vc from the power source section 22, and when brought into a state of capable of controlling the boosting section 24, starts a boosting control operation at step d1.

At step d1, before the boosting section 24 boosts, an output voltage of the standard solar cell string 1a is detected and stored, and the operation goes to step d2. At step d2, based on the detected output of the standard solar cell string 1a, a boosting upper limit voltage of the boosting section 24 is set, and the operation goes to step d3.

At step d3, the control section 23 carries out maximum power point tracking control as at step a1 described before, an optimum voltage Vs that electric power outputted from the non-standard solar cell string 1b becomes the maximum is detected, and the operation goes to step d4. At step d4, in the state of keeping a voltage supplied from the non-standard solar cell string 1b to the optimum voltage Vs, the-boosting section 24 is controlled so as to boost and output the DC voltage, and the operation goes to step d5.

At step d5, it is determined whether a voltage boosted by the boosting section 24 exceeds the boosting upper limit value set at step d2, and when it exceeds the boosting upper limit value, the operation goes to step d6 to stop the boosting operation, and goes back to step d1.

Further, when a voltage boosted by the boosting section 24 is not over the boosting upper limit value at step d5, the operation goes to step d7. At step d7, it is determined whether electric power of the standard solar cell string 1a is equal to or more than a defined value, and in the case of not being equal to or more than a defined value, the operation goes back to step d1. On the other hand, in the case of not being equal to or more than a defined value, the operation goes to step d8 to continue the boosting operation, and the boosting control operation is ended at step d9.

Further, also in the composition that the backflow prevention diode is contained in the voltage regulating means 2a as shown in FIG. 9, it is possible to obtain the same effect by executing the same control.

On the other hand, when the connection box 3 with the backflow prevention diodes 31 disposed to all of the solar cell strings 1a, 1b is used as shown in FIG. 1, a voltage on the side of the solar cell system and a voltage on the side of the standard solar cell strings 1a are separated by the backflow prevention diodes 31, so that the voltage regulating means 2 cannot detect a voltage of the standard solar cell string 1a before boosting is started. In this case, by previously setting, in the control section 23, the upper limit of a boosting voltage that does not cause breakage of a device such as the power conditioner, and stopping a boosting operation for a specified time period (for example, about five minutes) when a voltage exceeds the upper limit of a boosting voltage, a voltage increase of the boosting section 24 is restricted. Consequently, until the standard solar cell string 1a begins electric power generation and the power conditioner 4 begins electric power generation, the boosting section 24 repeats the previous operation.

Figure 14:
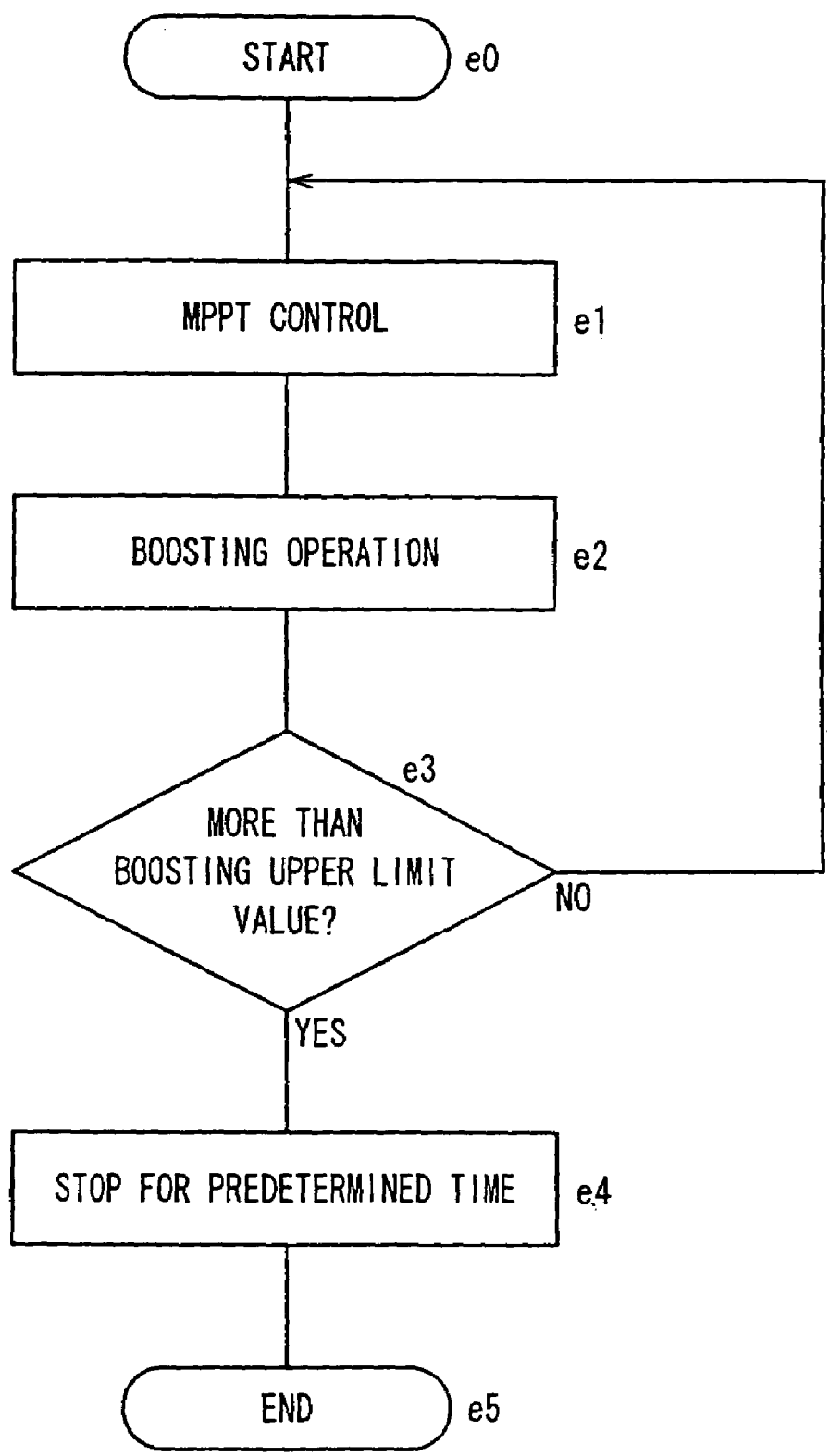
FIG. 14 is a flowchart showing another boosting control operation of the control section 23 of the photovoltaic power generation system 7 shown in FIG. 1.

FIG. 14 is a flowchart showing another boosting operation of the control section 23 of the photovoltaic power generation system shown in FIG. 1. The control section 23 operates at step e0 to step e2 in the same manner as at step a0 to step a2, and the operation goes to step e3. At step e3, it is determined whether a voltage exceeds a predetermined boosting upper limit value, and when the voltage does not exceed the boosting upper limit value, the operation goes back to step e1. On the other hand, when the voltage exceeds the boosting upper limit value, the operation goes to step e4 to stop for a predetermined time period, and a boosting control operation is ended.

In such a photovoltaic power generation system using an automatic boosting function, it is possible to control so that a non-standard solar cell string system US made by the non-standard solar cell string 1b and the voltage regulating means 2c does not operate independently when the standard solar cell string 1a does not generate electric power, and the power conditioner 4 is capable of executing control at an optimum control voltage. Although when control of preventing an independent operation of the non-standard solar cell string system US is carried out, the power conditioner 4 does not begin operation even when the non-standard solar cell string system US begins electric power generation earlier, and therefore, the generated electric power cannot be used, insolation is low at ordinary actuation time (for example, in the morning) and actuation electric power of the power conditioner 4 is low enough, so that electric power loss due to prevention of the independent operation is extremely low, which does not matter. Moreover, a problem that an MPPT mechanism on the power conditioner side wrongfully recognizes the maximum output operation point when the non-standard solar cell string 1b operates earlier than the standard solar cell string 1a can be solved by combining with control by detection of voltage variation described later.

Further, in order to prevent the independent operation, a method for detecting voltage variation as described below may be used. By detecting a voltage increase rate ($\Delta V/\Delta T$) of a voltage supplied to the output side of the voltage regulating means 2c, that is, the electric power converting means, detecting the value of the voltage increase rate during a preset time period (for example, one second), and detecting and comparing voltage variation, for example, voltage decrease of the increased voltage on the output side of the voltage regulating means 2c arising at the moment that the power conditioner 4 activates, it is determined whether the maximum output operation point recognized by the power conditioner 4 at the moment results from the standard solar cell string 1a or results from the non-standard solar cell string 1b. In specific, voltage increase arises in a short time period (for example, a few seconds) before actuation of the power conditioner, that is, in an unloaded state in the non-standard solar cell string 1b, and this causes voltage decrease rapidly (for example, in a few seconds) when the power conditioner 4 activates and loads from the nature of conversion of a current to a voltage by the voltage regulating means. By combining these two conditions, it is avoided to wrongfully recognize that an output voltage of the standard solar cell string 1a increases in a short time period, for example, when the sun comes out of the cloud. Then, control for avoiding wrong recognition may be control of detecting the independent operation and stopping a boosting operation for a specified time period so that the non-standard solar cell string system US is not used for determination of the maximum output operation point of the power conditioner earlier than the standard solar cell string 1a.

Figure 15:
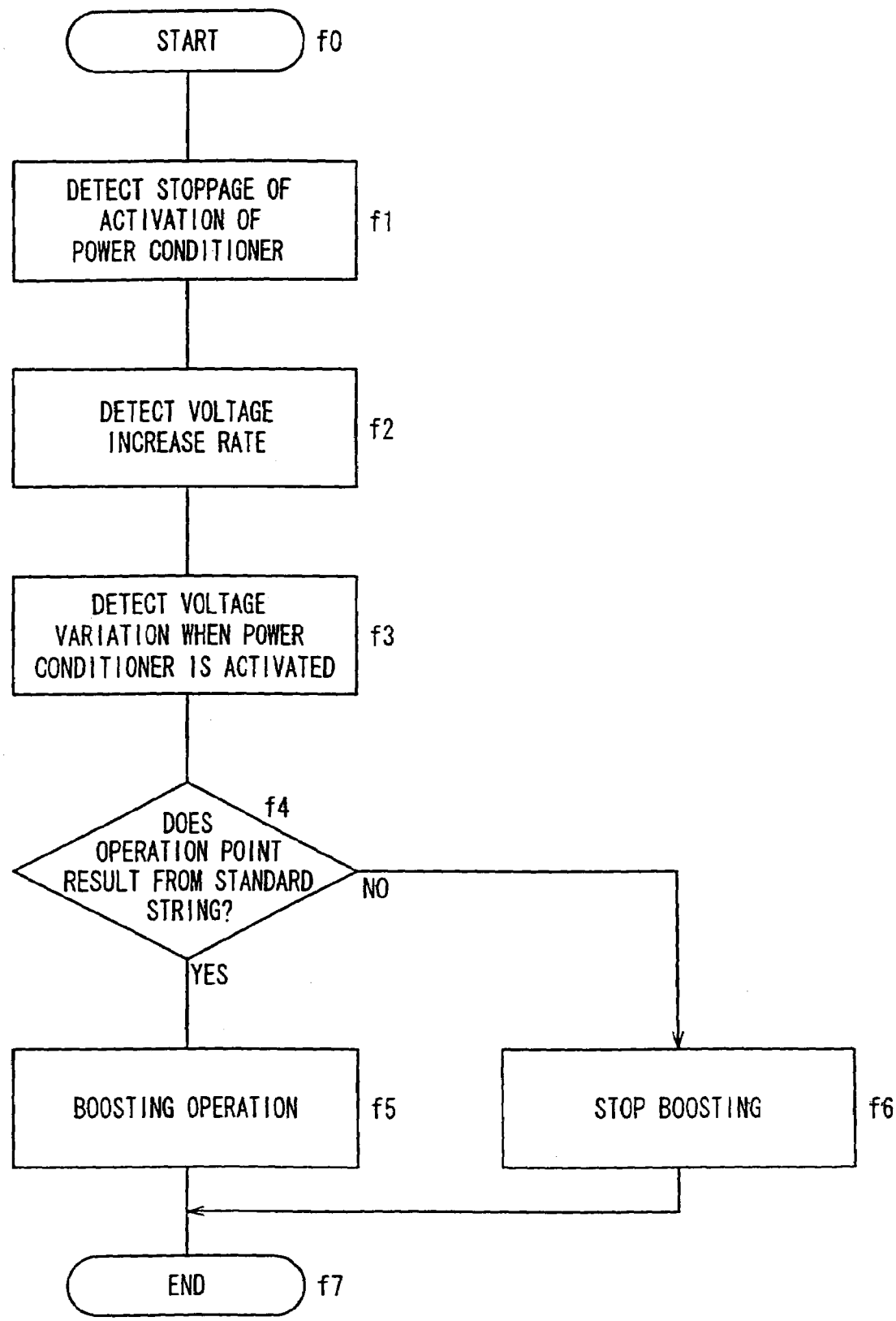
FIG. 15 is a flowchart showing still another boosting control operation of the respective control sections 23.

FIG. 15 is a flowchart showing still another boosting control operation of the respective control sections. Firstly, the control section 23 operates at step f0 in the same manner as at step a0 described before, and begins the boosting control operation at step f1.

At step f1, stoppage of activation of the power conditioner is detected, and the operation goes to step f2. At step f2, the increase rate of a voltage outputted from the voltage regulating means is calculated, and the operation goes to step f3. At step f3, regarding the increased voltage value, voltage variation caused by the power conditioner before and after activation is detected, it is determined whether an operation point recognized by the power conditioner 4 results from the standard solar cell string 1a or results from the non-standard solar cell string 1b, and the operation goes to step f4.

When it is determined at step f4 that the operation point of the power conditioner results from the standard solar cell string 1a, the operation goes to step f5, and otherwise, the operation goes to step f6. At step f5, the boosting control operation as shown in FIGS. 6, 10, 13, 14 is carried out, and the operation goes to step f7, where the operation is ended. On the other hand, at step f6, the boosting operation is stopped, and the operation goes to step f7, where the operation is ended.

Such control by preventing the independent operation of the non-standard solar cell string system US can be applied to the photovoltaic power generation system of the embodiment described before. In the detection, the capacity of electric power of the non-standard solar cell string 1b is smaller than that of the standard solar cell string 1a. Consequently, operation in a state where an output voltage of the voltage regulating means 2 is higher than an output voltage of the standard solar cell string 1a is avoided, and it is possible to operate in an appropriate state as a photovoltaic power generation system with small electric power loss.

Although an example of disposing the voltage regulating means 2 to the non-standard solar cell string 1b and matching an output voltage thereof with that of the standard solar cell string 1a by boosting is illustrated above, it is needless to say that in a composition that a voltage of the non-standard solar cell string 1b is higher than that of the standard solar cell string 1a, in the case of bucking an output voltage of the non-standard solar cell string 1b by the voltage regulating means 2 and matching with an output voltage of the standard solar cell string 1a, the same effect can be obtained.

Figure 16:
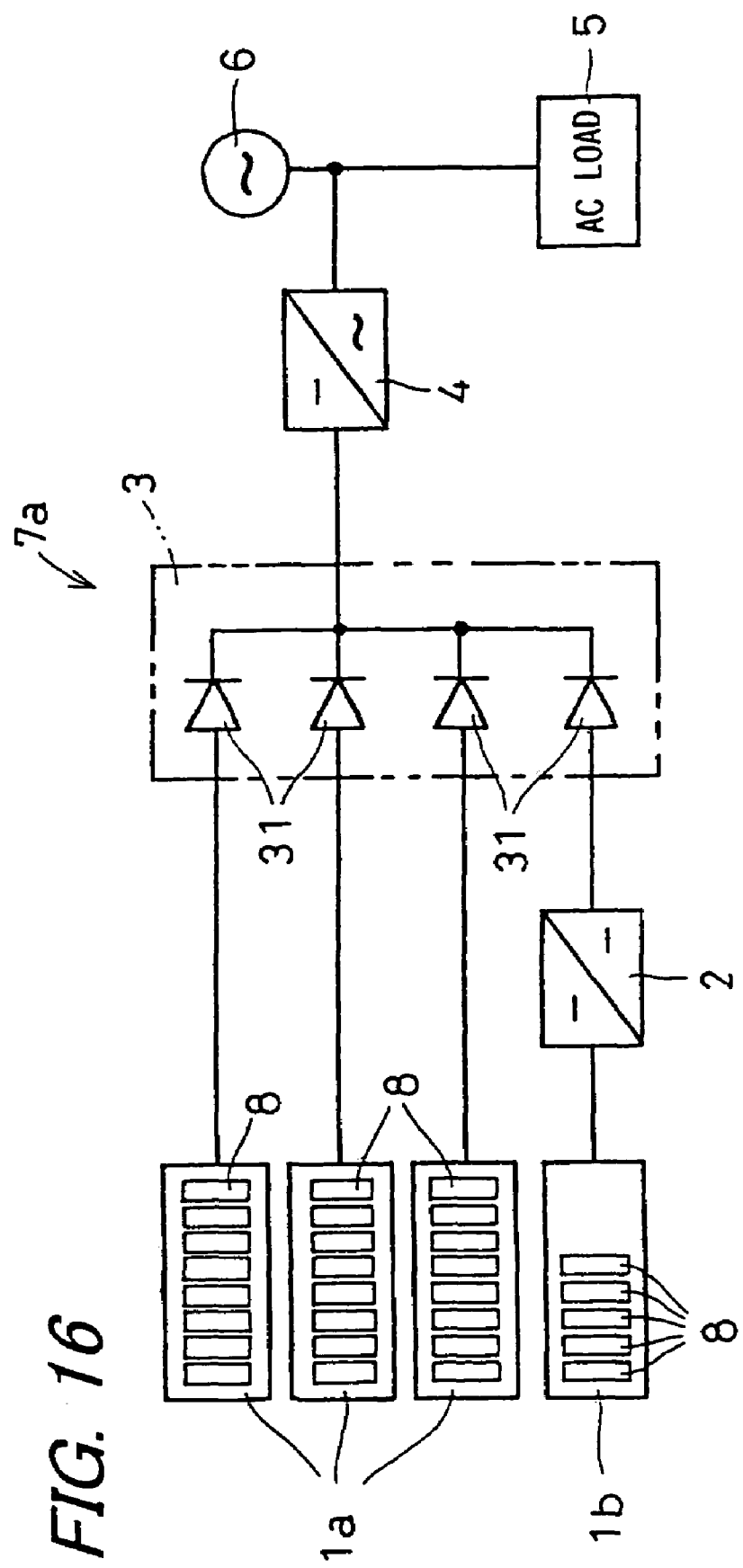
FIG. 16 is a schematic block diagram showing a boosting-type photovoltaic power generation system 7a disposed to the roof faces shown in FIG. 2.
Figure 17:
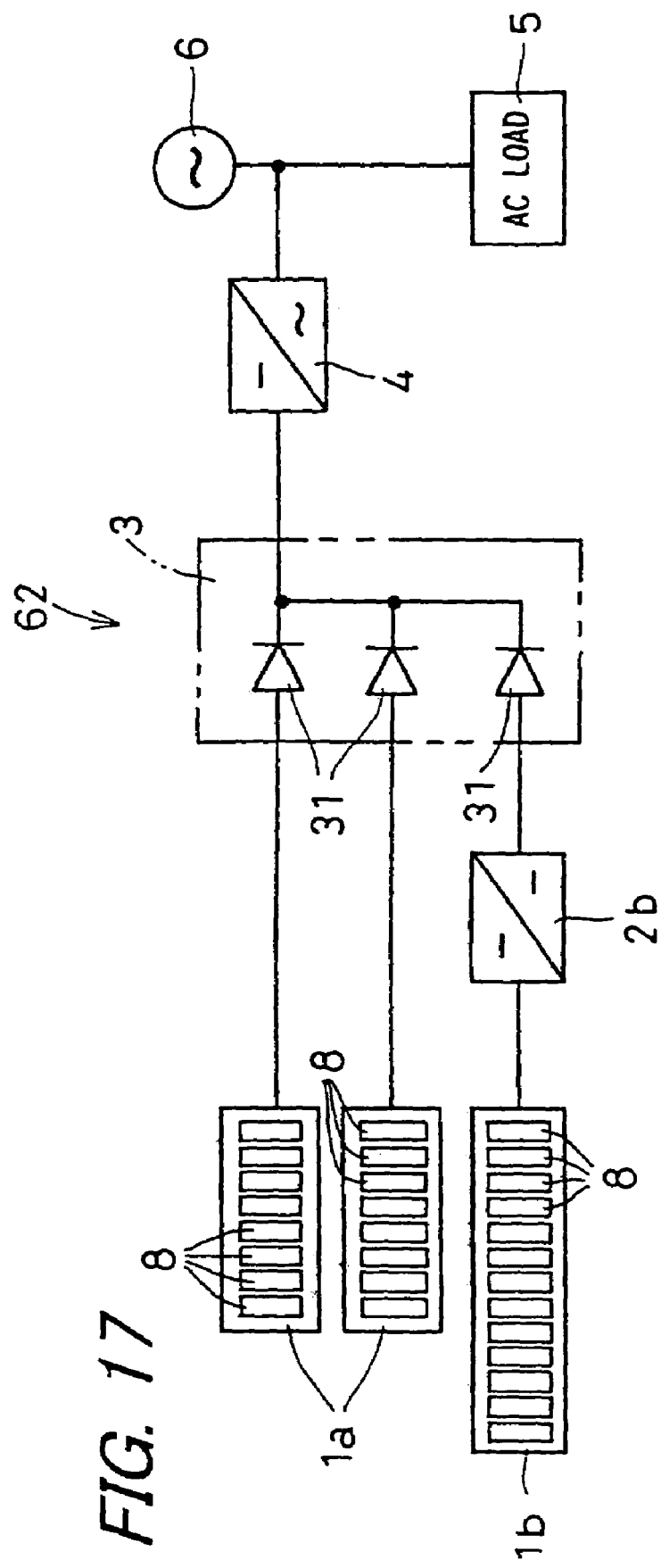
FIG. 17 is a schematic block diagram showing a buck-type photovoltaic power generation system 62 disposed to the roof faces shown in FIG. 2.

In this case, for example, when a string has boosting-type voltage regulating means 2 on the hipped roof that twenty nine solar cell modules 8 can be placed as shown in FIG. 2, there are three standard solar cell strings 1a, each of which has eight solar cell modules 8, and one non-standard solar cell string 1b having five solar cell modules 8 as shown in FIG. 16. On the contrary, when the voltage regulating means 2 is of buck type, there are two standard solar cell strings 1a, each of which has eight solar cell modules 8 and one non-standard solar cell string 1b having thirteen solar cell modules 8 as shown in FIG. 17. In this example, it is possible to reduce the wiring number in the buck type as compared with in the boosting type. Then, since values of output electric power obtained in both methods are the same, by selecting the serial/parallel number of solar cell modules, the wiring number and the boosting type or the buck type by combination of the installation number and output voltages, it is possible to make the wiring efficient and reduce the routing number.

Figure 18:
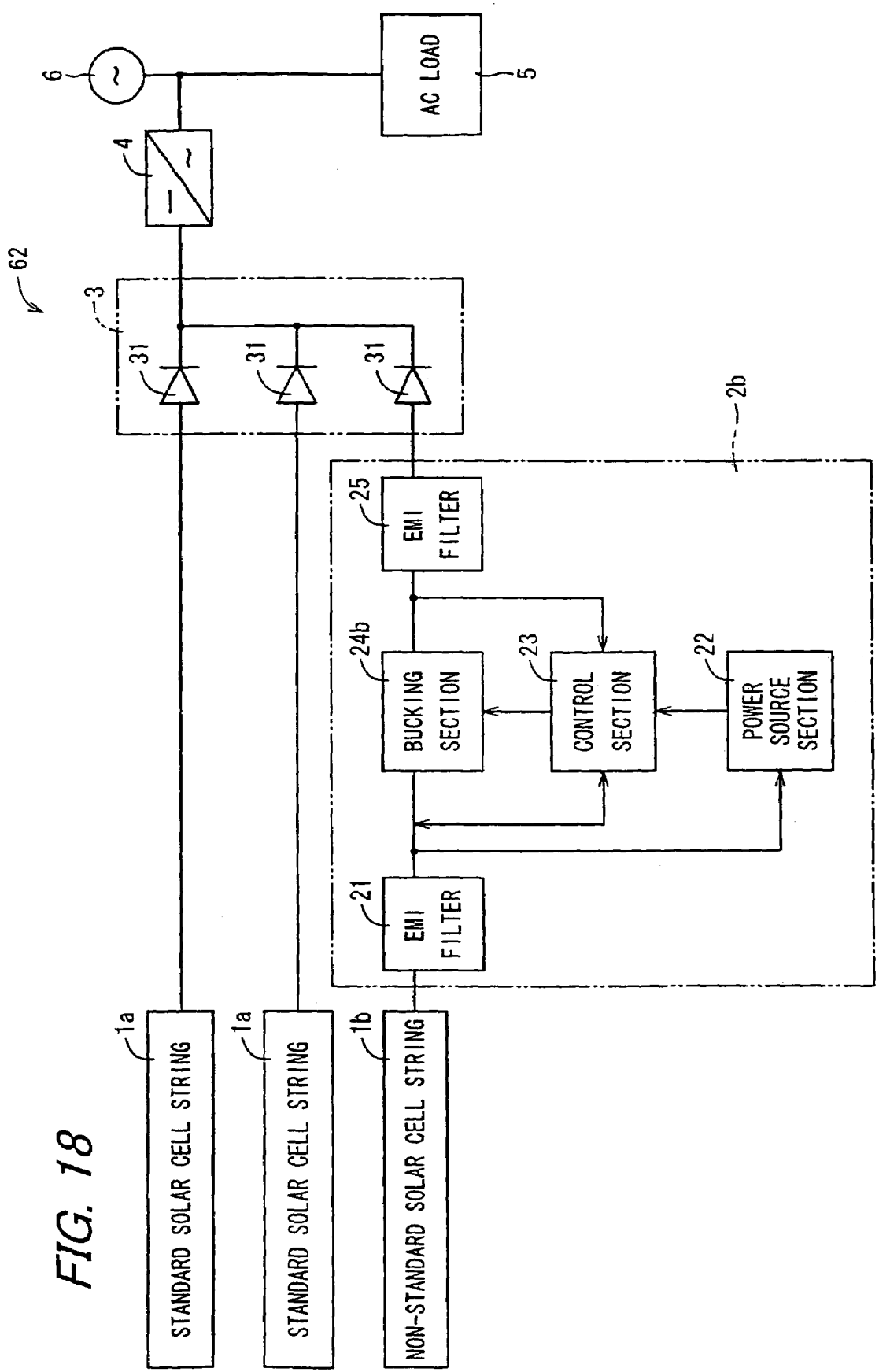
FIG. 18 is a block diagram that diagrammatically shows an example of buck-type voltage regulating means 2b.

FIG. 18 is a block diagram showing the detail of buck-type voltage regulating means 2b. In the case of the buck type, instead of the boosting section 24 of the boosting-type voltage regulating means 2 shown in FIG. 4, a bucking section 24b is disposed. The bucking section 24b is produced by a bucking chopper circuit, for example. The bucking section 24b carries out an operation of bucking a supplied voltage corresponding to a boosting operation of the boosting section 24 as described before.

When the backflow prevention diode 31 is not provided in the voltage regulating means 2b, a bucked voltage is outputted which is lower than a predetermined activation voltage of the power conditioner 4. Next, when a current does not flow from the bucking section 24b toward the connection box 3, a voltage is gradually increased and outputted. Then, when a voltage outputted from the bucking section 24b becomes equal to or more than the activation voltage of the power conditioner 4, bucking control and MPPT control of an output voltage is carried out so that the maximum current can be outputted.

Further, when the backflow prevention diode 31 is contained in the bucking section 24b, the operation is almost the same as that of the flowchart shown in FIG. 10, a bucking ratio is defined by dividing an optimum voltage Vl of the standard solar cell string 1a by an optimum voltage Vs of the non-standard solar cell string 1b, and a bucking operation is carried out based on the bucking ratio.

Figure 19:
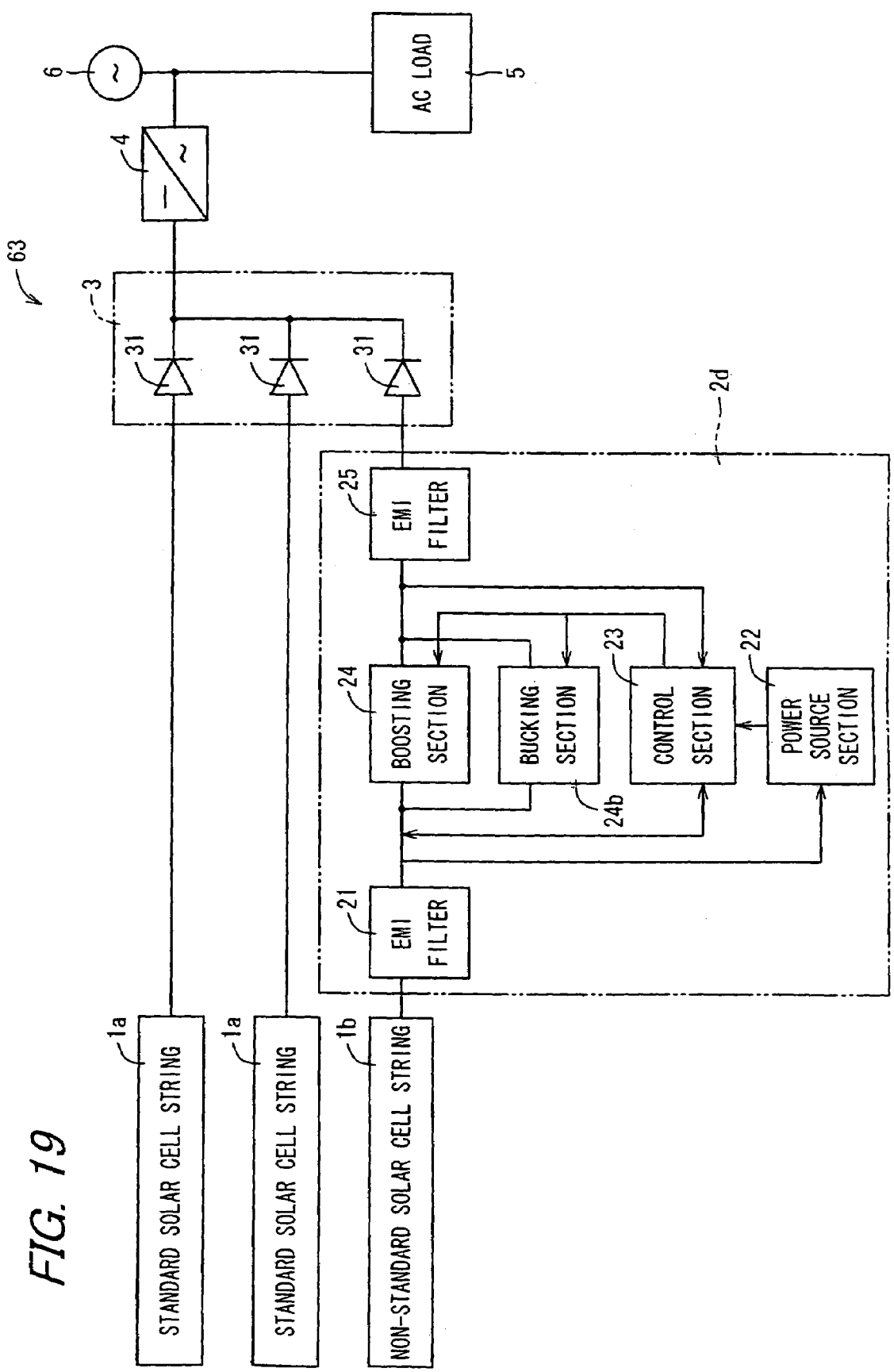
FIG. 19 is a block diagram that diagrammatically shows an example of voltage regulating means 2d capable of boosting and bucking.

FIG. 19 is a block diagram showing the detail of the voltage regulating means 2d capable of bucking and boosting.

As shown in FIG. 19, the voltage regulating means 2d may have the boosting section 24 and the bucking section 24b. In this case, the control section 23 has a boosting and bucking automatic switching circuit. In this case, the voltage regulating means 2d is a DC-DC converting device which is capable of voltage regulation in both methods of boosting and bucking, monitors an output voltage of the non-standard solar cell string 1b, and also monitors an output voltage of the standard solar cell string 1a from the output side of the backflow prevention diode 31. In the voltage regulating means 2d, the control section 23 switches control methods so that the bucking section 24b, which is a buck-type voltage regulating circuit, operates when an output voltage of the non-standard solar cell string 1b is higher than an output voltage of the standard solar cell string 1a, and the boosting section 24, which is a boosting-type voltage regulating circuit, operates when an output voltage of the non-standard solar cell string 1b is lower than an output voltage of the standard solar cell string 1a.

Figure 20:
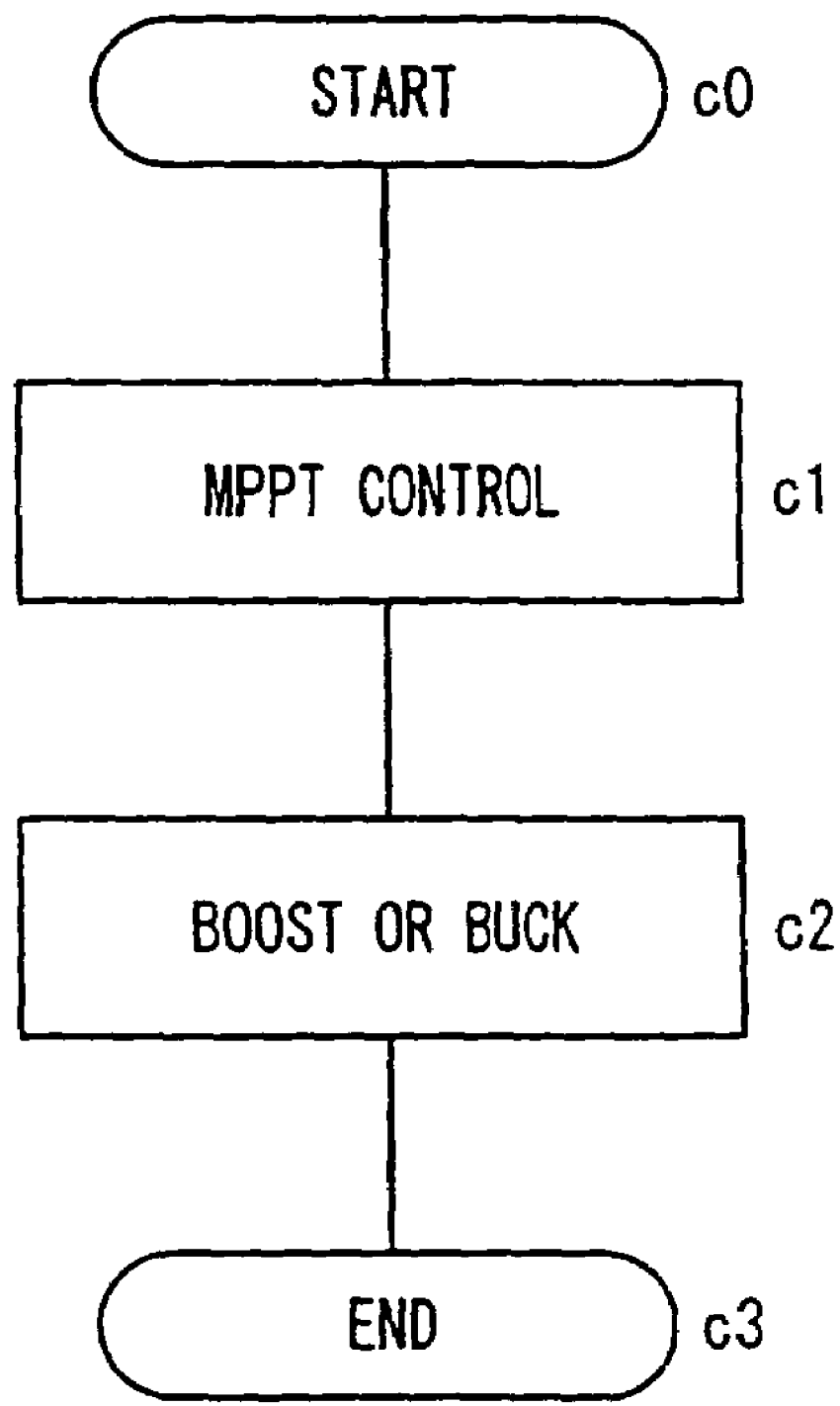
FIG. 20 is a flowchart showing an operation of the control section 23 that is capable of boosting and bucking operations.
Figure 21:
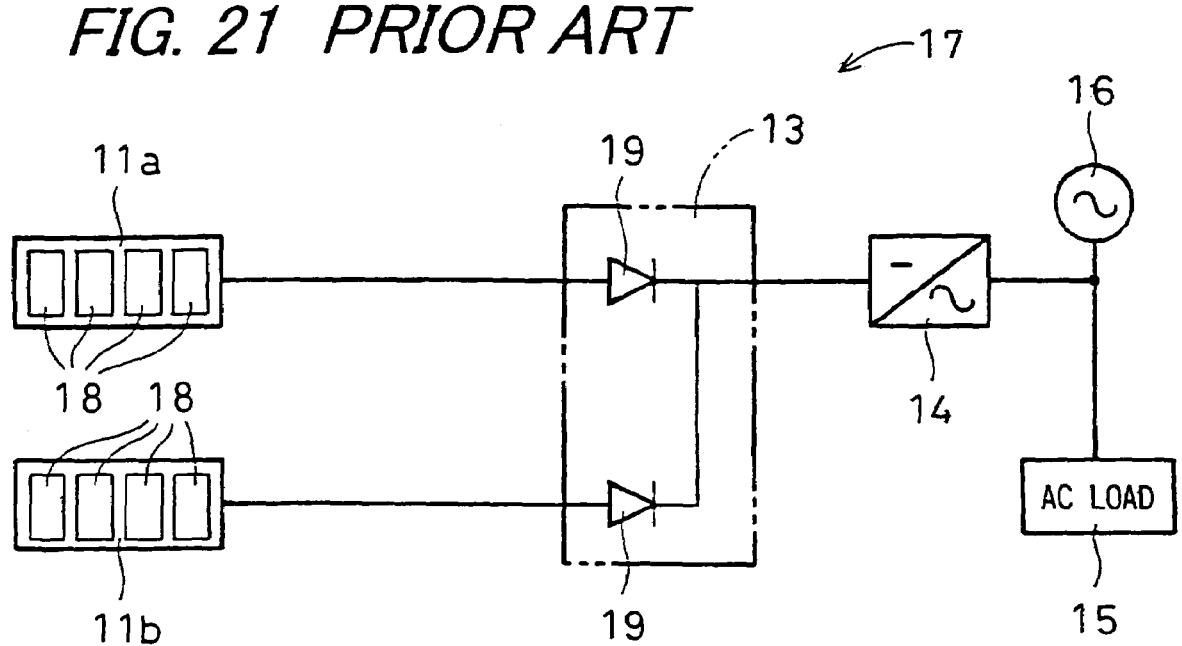
FIG. 21 is a schematic block diagram for diagrammatically describing a photovoltaic power generation system 17 of a prior art.

FIG. 20 is a flowchart showing an operation of a control section of the voltage regulating means 2d that is capable of bucking and boosting. The control section 23 carries out the same operations at step c0 and step c1 as at step a0 to step a2 described before, and the operation goes to step c2.

At step c2, a voltage of the non-standard solar cell string 1a is boosted or bucked so that a voltage outputted from the non-standard solar cell string 1b becomes the optimum voltage Vs, and the operation goes to step c3. At step c3, the boosting/bucking operation is ended.

In this manner, by comparing output voltages of the standard solar cell string 1a and the non-standard solar cell string 1b, either voltage regulation method is selected.

Besides, although voltage regulation by bucking is carried out in normal in a solar cell string installed at a place where decrease of an output is caused because of being shadowed in a certain time period such as in the morning and evening or because of bad insolation, it is possible, by executing voltage regulation by boosting only in the subject time period, to take out output electric power of the solar cell string that cannot contribute to electric power generation only by buck-type voltage regulation, so that it is possible to not only increase the amount of generated electric power but also install even in a place that was incapable of satisfying the conditions of installing a solar cell string so far.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A photovoltaic power generation system comprising:
a first solar cell string composed of a plurality of solar cell elements or solar cell element groups connected in series;
a second solar cell string composed of a plurality of solar cell elements or solar cell element groups connected in series, the second solar cell string being connected to the first solar cell string in parallel;
electric power converting means for converting DC electric power outputted from these solar cell strings, to AC electric power and controlling so that a maximum output electric power is inputted;

boosting means disposed between the second solar cell string and the electric power converting means, for carrying out boosting DC voltage outputted from the second solar cell string so that a maximum output electric power is inputted and so that the output voltage of the second solar cell string is equal to the output voltage of the first solar cell string and controlling the regulated output voltage so as not to be higher than the output voltage from the first solar cell string; and voltage regulating means disposed between the second solar cell string and the electric power converting means, for regulating a DC voltage outputted from the second solar cell string, and regulating an output voltage of the second solar cell string to be close to an output voltage of the first solar cell string, wherein, the voltage regulating means has a controlling section for controlling an operation so as to stop regulation of the DC voltage of the DC electric power supplied from the second solar cell string when the second solar cell string begins electric power generation earlier than the first solar cell string, and the electric power converting means is actuated by the first solar cell string.

2. The photovoltaic power generation system of claim 1, wherein voltage regulation by the voltage regulating means is carried out based on a voltage for a maximum electric power of the second solar cell string.

3. A photovoltaic power generation system comprising:

a first solar cell string composed of a plurality of solar cell elements or solar cell element groups connected in series;

a second solar cell string composed of a plurality of solar cell elements or solar cell element groups connected in series, and connected to the first solar cell string in parallel, electric power generated by the second solar cell string being lower than that of the first solar cell string;

electric power converting means for converting DC electric power outputted from these solar cell strings to AC electric power and controlling so that a maximum output electric power is inputted; and boosting means disposed between the second solar cell string and the electric power converting means, for carrying out boosting DC voltage outputted from the second solar cell string so that a maximum output electric power is inputted and so that the output voltage of the second solar cell string is equal to the output voltage of the first solar cell string and controlling the regulated output voltage so as not to be higher than the output voltage from the first solar cell string, wherein, the boosting means has a controlling section for controlling an operation so as to stop a boosting operation when the second solar cell string begins electric power generation earlier than the first solar cell string, and the electric power converting means is actuated by the first solar cell string.

4. A photovoltaic power generation system comprising:

a first solar cell string composed of a plurality of solar cell elements connected to each other;

a second solar cell string composed of a plurality of solar cell elements connected to each other, the second solar cell string being connected to the first solar cell string in parallel;

electric power converting means for converting DC electric power outputted from the first and second solar cell strings and supplied thereto, at a conversion voltage Vm at which a maximum DC electric power is supplied, to AC electric power; and voltage regulating means interposed in a connection path which electrically connects the second solar cell string and the electric power converting means, for regulating a DC voltage of the DC electric power supplied from the second solar cell string so as to be close to a conversion voltage Vm, wherein the voltage regulating means has a controlling section for controlling an operation so as to stop regulation of the DC voltage of the DC electric power supplied from the second solar cell string when the second solar cell string begins electric power generation earlier than the first solar cell string.

5. The photovoltaic power generation system of claim 4, wherein the DC electric power supplied from the first solar cell string is directly supplied to the electric power converting means.

6. The photovoltaic power generation system of claim 4, wherein the voltage regulating means is disposed to the second solar cell string so as to be attachable and detachable.

7. The photovoltaic power generation system of claim 4, wherein the voltage regulating means has:

a regulating section for supplying the DC electric power from the second solar cell string, to the electric power converting means after DC voltage regulation of at least either boosting or bucking;

a power source section for driving the regulating section by the use of DC electric power supplied from the second solar cell string; and a control section for controlling the regulating section.

8. The photovoltaic power generation system of claim 7, wherein:

the regulating section comprises a chopper circuit including an inductor, a diode and a switching element, and the control section controls the switching element to either boost or buck a supplied DC voltage.

9. The photovoltaic power generation system of claim 4, wherein:

a backflow prevention diode for preventing current from flowing from the first solar cell string to the second solar cell string is disposed; and the voltage regulating means regulates a DC voltage supplied from the second solar cell string based on the presence of a current flowing from the voltage regulating means section to the electric power converting means.

10. The photovoltaic power generation system of claim 4, wherein the voltage regulating means;

calculates a voltage ratio between the optimum voltage Vl at which a maximum DC electric power is supplied from the first solar cell string and the optimum voltage Vs at which a maximum DC electric power is supplied from the second solar cell string; and regulates the DC voltage of the DC electric power supplied from the second solar cell string based on the voltage ratio.

11. The photovoltaic power generation system of claim 4, wherein the DC electric power supplied from the second solar cell string is supplied to the electric power converting means after DC voltage regulation of boosting by the voltage regulating means.

12. The photovoltaic power generation system of claim 4, wherein the DC electric power supplied from the second solar cell string is supplied to the electric power converting means after the DC voltage of the DC electric power is bucked by the voltage regulating means.

13. The photovoltaic power generation system of claim 4, wherein the DC electric power supplied from the second solar cell string is supplied to the electric power converting means after DC voltage regulation of boosting or bucking in accordance with predetermined rules by the voltage regulating means.

14. The photovoltaic power generation system of claim 4, wherein the voltage regulating means controls a DC voltage supplied to the electric power converting means so as not to become higher than a rated maximum DC voltage from the first solar cell string.

15. The photovoltaic power generation system of claim 4, wherein the voltage regulating means stops regulation of a DC voltage of the DC electric power supplied from the second solar cell string when the second solar cell string begins electric power generation earlier than the first solar cell string, and the electric power converting means converts a DC electric power supplied from the first solar cell string to AC electric power.

16. The photovoltaic power generation system of claim 4, wherein the voltage regulating means determines for which of the first solar cell string or the second solar cell string the electric power converting means carried out regulation of DC voltage and regulates the DC output electric power from the second solar cell string based on a result of the determination.

17. A photovoltaic power generation system comprising:
a first solar cell string composed of a plurality of solar cell elements connected to each other;
a second solar cell string composed of a plurality of solar cell elements connected to each other, the second solar cell string being connected to the first solar cell string in parallel;
electric power converting means for converting DC electric power outputted from the first and second solar cell strings and supplied thereto at a conversion voltage Vm at which a maximum DC electric power is supplied, to AC electric power; and
voltage regulating means interposed in a connection path which electrically connects the second solar cell string and the electric power converting means, for regulating a DC voltage of the DC electric power supplied from the second solar cell string so that a maximum DC electric power is supplied from the second solar cell string,
wherein the voltage regulating means has a controlling section for controlling an operation so as to stop regulation of the DC voltage of the DC electric power supplied from the second solar cell string when the second solar cell string begins electric power generation earlier than the first solar cell string.

18. The photovoltaic power generation system of claim 17, wherein the DC electric power supplied from the first solar cell string is directly supplied to the electric power converting means.

19. The photovoltaic power generation system of claim 17, wherein the voltage regulating means is disposed to the second solar cell string so as to be attachable and detachable.

20. The photovoltaic power generation system of claim 17, wherein the voltage regulating means has:
a regulating section for supplying the DC electric power supplied from the second solar cell string, to the electric power converting means after DC voltage regulation of at least either boosting or bucking;
a power source section for driving the regulating section by the use of DC electric power supplied from the second solar cell string; and
a control section for controlling the regulating section.

21. The photovoltaic power generation system of claim 20, wherein:
the regulating section comprises a chopper circuit including an inductor, a diode and a switching element, and
the control section controls the switching element to either boost or buck a supplied DC voltage.

22. The photovoltaic power generation system of claim 17, wherein the DC electric power supplied from the second solar cell string is supplied to the electric power converting means after DC voltage regulation of boosting by the voltage regulating means.

23. The photovoltaic power generation system of claim 17, wherein the DC electric power supplied from the second solar cell string is supplied to the electric power converting means after the DC voltage of the DC electric power is bucked by the voltage regulating means.

24. The photovoltaic power generation system of claim 17, wherein the DC electric power supplied from the second solar cell string is supplied to the electric power converting means after DC voltage regulation of boosting or bucking in accordance with predetermined rules by the voltage regulating means.

25. The photovoltaic power generation system of claim 17, wherein the voltage regulating means controls a DC voltage supplied to the electric power converting means so as not to become higher than a rated maximum DC voltage from the first solar cell string.

26. The photovoltaic power generation system of claim 17, wherein the voltage regulating means stops regulation of the DC voltage of the DC electric power supplied from the second solar cell string when the second solar cell string begins electric power generation earlier than the first solar cell string, and the electric power converting means converts the DC electric power supplied from the first solar cell string to AC electric power.

27. The photovoltaic power generation system of claim 17, wherein the voltage regulating means determines for which of the first solar cell string or the second solar cell string the electric power converting means carried out regulation of DC voltage and regulates the DC output electric power from the second solar cell string based on a result of the determination.

* * * * *